(12) United States Patent
Chen et al.

(10) Patent No.: US 12,165,929 B2
(45) Date of Patent: Dec. 10, 2024

(54) SEMICONDUCTOR DEVICE AND METHOD

(71) Applicant: Taiwan Semiconductor Manufacturing Co., Ltd., Hsinchu (TW)

(72) Inventors: Chun-Han Chen, Changhua (TW); Chen-Ming Lee, Yangmei (TW); Fu-Kai Yang, Hsinchu (TW); Mei-Yun Wang, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 9 days.

(21) Appl. No.: 17/876,083

(22) Filed: Jul. 28, 2022

(65) Prior Publication Data

US 2022/0384276 A1 Dec. 1, 2022

Related U.S. Application Data

(62) Division of application No. 16/881,979, filed on May 22, 2020, now Pat. No. 11,450,572.

(51) Int. Cl.
*H01L 21/8238* (2006.01)
*H01L 21/02* (2006.01)
(Continued)

(52) U.S. Cl.
CPC ............ *H01L 21/823871* (2013.01); *H01L 21/02164* (2013.01); *H01L 21/02238* (2013.01); *H01L 21/28518* (2013.01); *H01L 21/31111* (2013.01); *H01L 21/823814* (2013.01); *H01L 21/823821* (2013.01); *H01L 27/0924* (2013.01); *H01L 29/0847* (2013.01); *H01L 29/165* (2013.01); *H01L 29/267* (2013.01);
(Continued)

(58) Field of Classification Search
CPC ..... H01L 21/823418; H01L 21/823814; H01L 21/823431; H01L 21/823821; H01L 29/41791; H01L 21/823871; H01L 21/823475; H01L 29/66795; H01L 29/7848

See application file for complete search history.

(56) References Cited

U.S. PATENT DOCUMENTS 9,105,490 B2  8/2015  Wang et al.
9,214,556 B2  12/2015  Wann et al.
(Continued)

FOREIGN PATENT DOCUMENTS

KR  20150018343 A  2/2015

*Primary Examiner* — Bac H Au
(74) *Attorney, Agent, or Firm* — Slater Matsil, LLP

(57) ABSTRACT

In an embodiment, a device includes: a semiconductor substrate; a first fin extending from the semiconductor substrate; a second fin extending from the semiconductor substrate; an epitaxial source/drain region including: a main layer in the first fin and the second fin, the main layer including a first semiconductor material, the main layer having an upper faceted surface and a lower faceted surface, the upper faceted surface and the lower faceted surface each being raised from respective surfaces of the first fin and the second fin; and a semiconductor contact etch stop layer (CESL) contacting the upper faceted surface and the lower faceted surface of the main layer, the semiconductor CESL including a second semiconductor material, the second semiconductor material being different from the first semiconductor material.

20 Claims, 25 Drawing Sheets

(51) Int. Cl.
  *H01L 21/285* (2006.01)
  *H01L 21/311* (2006.01)
  *H01L 27/092* (2006.01)
  *H01L 29/08* (2006.01)
  *H01L 29/165* (2006.01)
  *H01L 29/267* (2006.01)
  *H01L 29/417* (2006.01)
  *H01L 29/45* (2006.01)
  *H01L 29/66* (2006.01)
  *H01L 29/78* (2006.01)

(52) U.S. Cl.
  CPC ........ *H01L 29/41791* (2013.01); *H01L 29/45* (2013.01); *H01L 29/66795* (2013.01); *H01L 29/7848* (2013.01); *H01L 29/7851* (2013.01)

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,566,246 B1 | 2/2020 | Wu et al. |
| 2014/0217517 A1 | 8/2014 | Cai et al. |
| 2016/0087053 A1 | 3/2016 | Kim et al. |
| 2016/0284806 A1 | 9/2016 | Park et al. |
| 2016/0351570 A1 | 12/2016 | Park et al. |
| 2017/0053916 A1 | 2/2017 | Ching et al. |
| 2017/0317205 A1 | 11/2017 | Lee et al. |
| 2018/0151683 A1 | 5/2018 | Yeo et al. |
| 2019/0097006 A1 | 3/2019 | Li et al. |
| 2019/0097051 A1 | 3/2019 | Tsai et al. |
| 2019/0123161 A1 | 4/2019 | Yeo et al. |
| 2019/0172752 A1 | 6/2019 | Hsu et al. |
| 2019/0273023 A1 | 9/2019 | Loh et al. |
| 2019/0312143 A1 | 10/2019 | Lin et al. |
| 2019/0319098 A1 | 10/2019 | Tai et al. |
| 2019/0333820 A1 | 10/2019 | Chang et al. |
| 2019/0348415 A1 | 11/2019 | Sung et al. |
| 2019/0371898 A1 | 12/2019 | Huang |
| 2020/0035549 A1 | 1/2020 | Wu |
| 2020/0035787 A1 | 1/2020 | Wang et al. |
| 2020/0105876 A1 | 4/2020 | Ting et al. |
| 2020/0105932 A1 | 4/2020 | Li et al. |

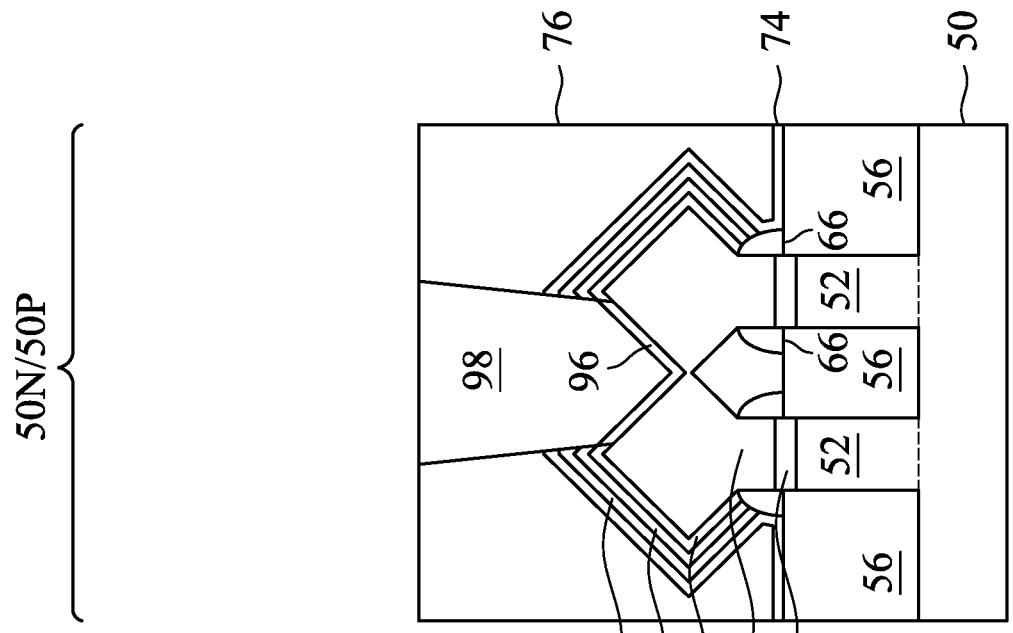
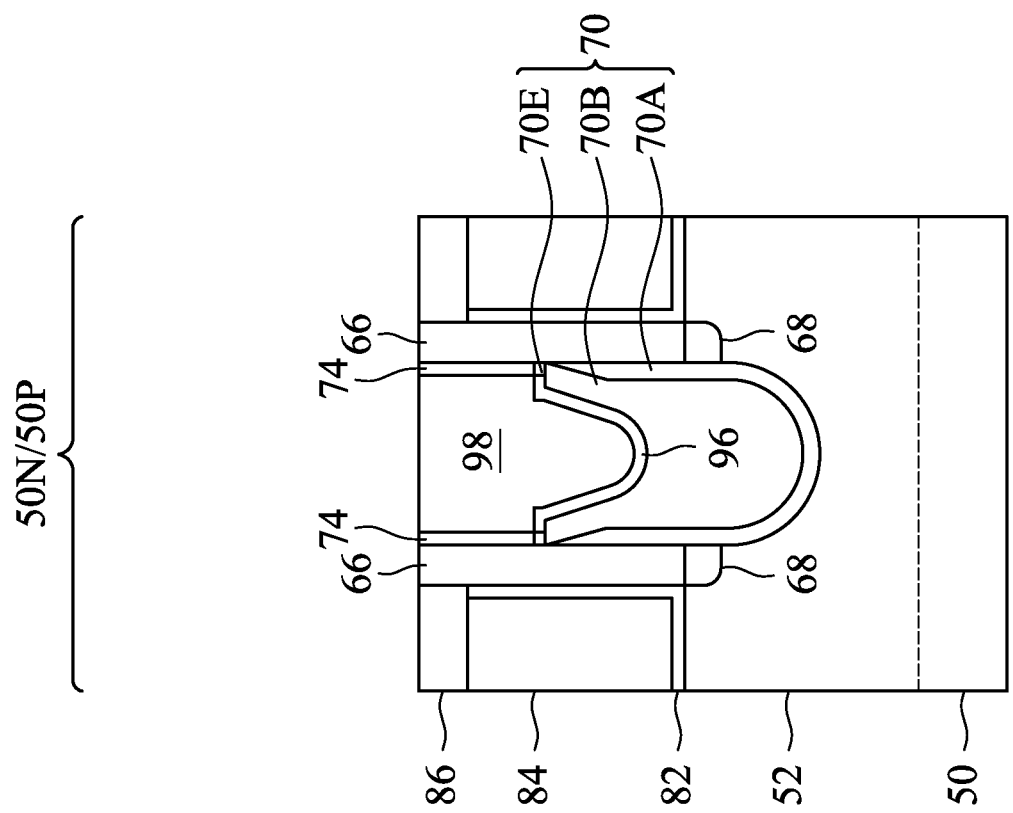
Figure 11A
Figure 11B

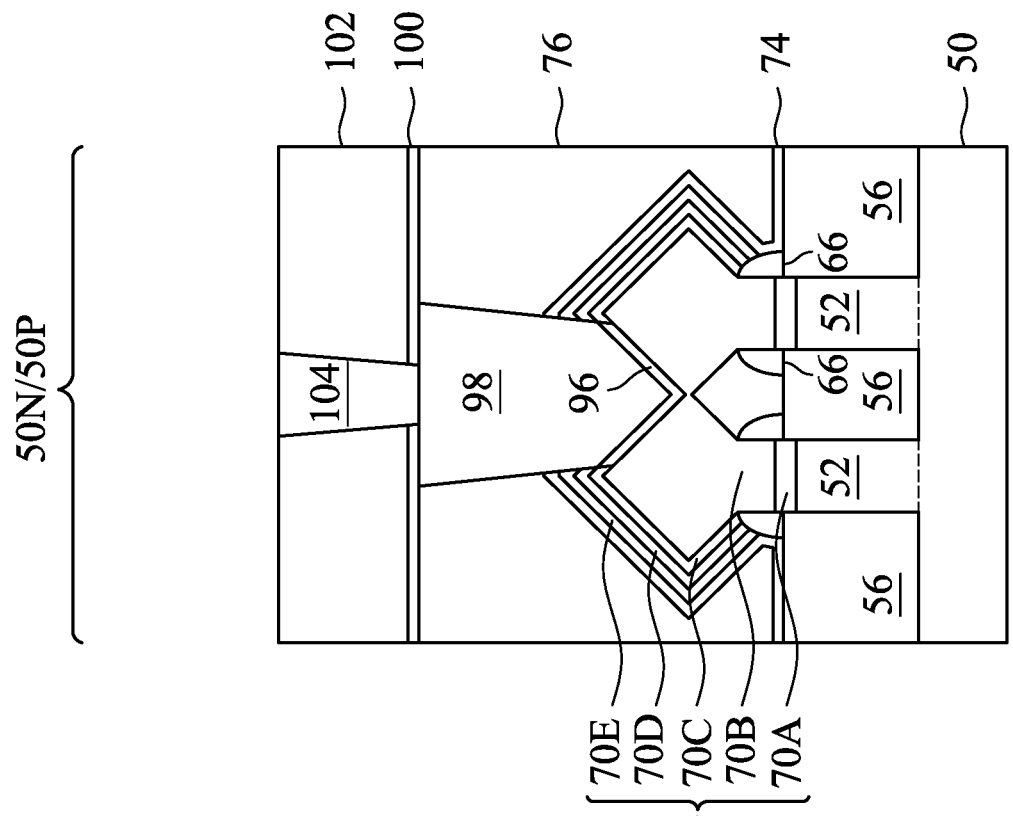
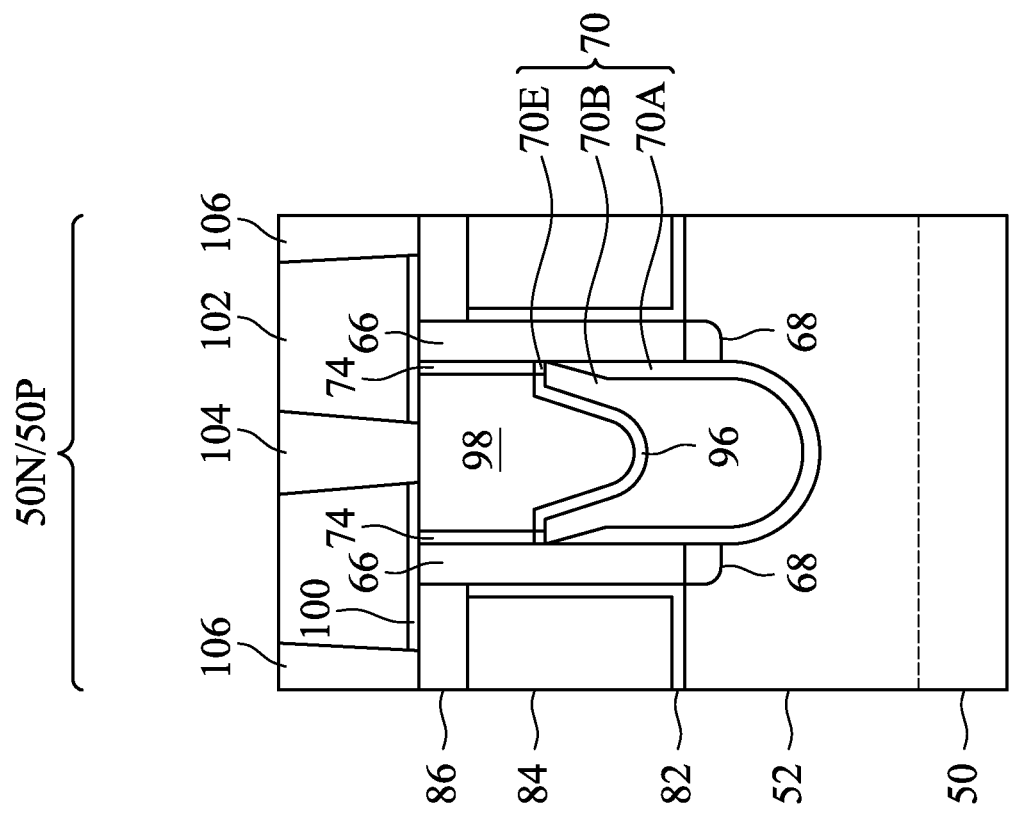
Figure 12B
Figure 12A

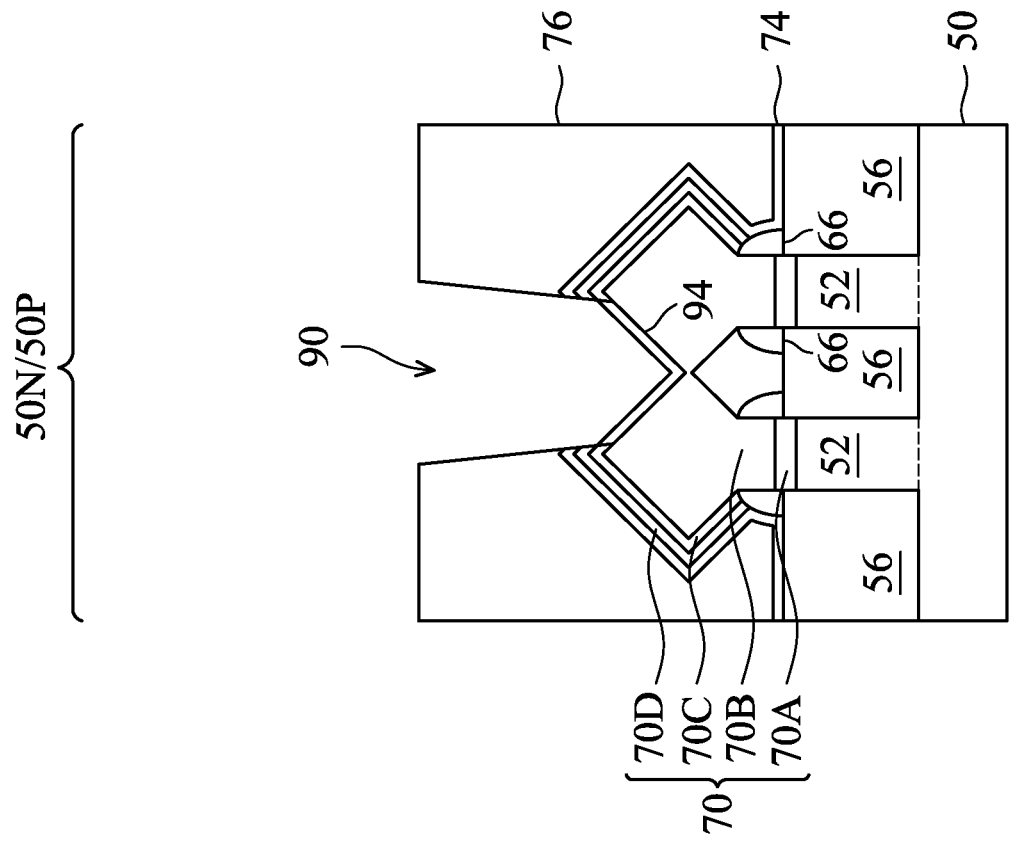
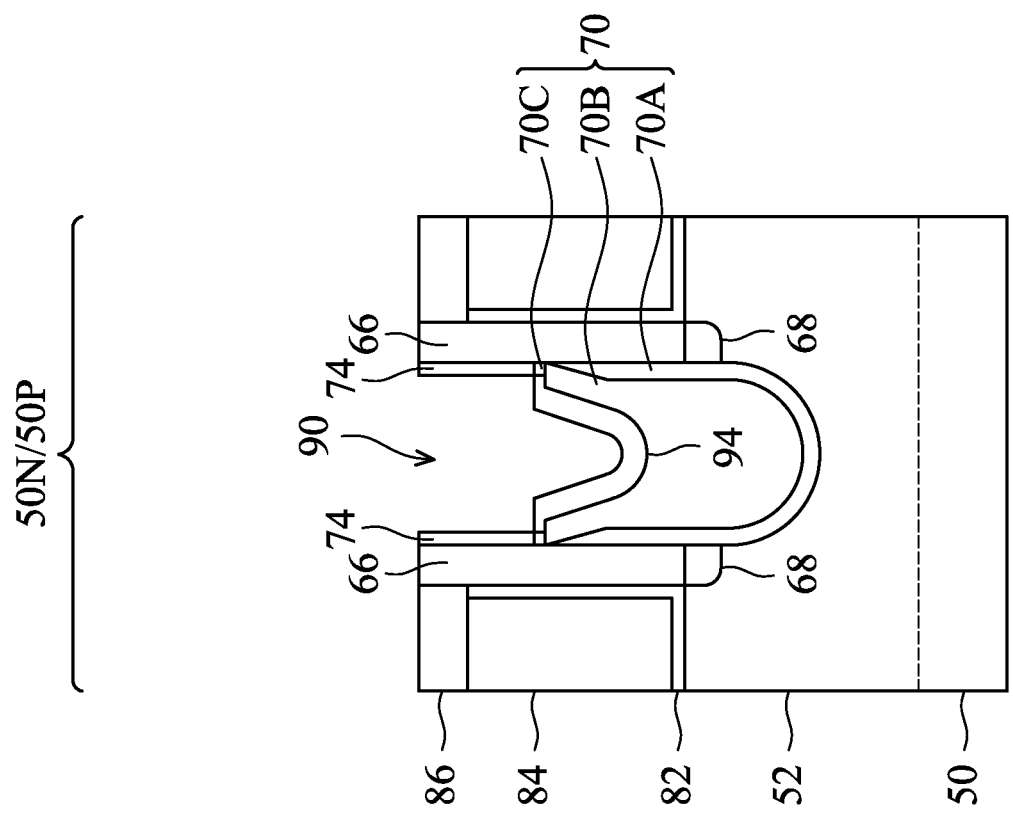
Figure 19B
Figure 19A

SEMICONDUCTOR DEVICE AND METHOD

PRIORITY CLAIM AND CROSS-REFERENCE

This application is a divisional of U.S. patent application Ser. No. 16/881,979, filed on May 22, 2020, entitled "Semiconductor Device and Method," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 12B are cross-sectional views of intermediate stages in the manufacturing of FinFETs, in accordance with some embodiments.

FIGS. 17A through 21B are cross-sectional views of intermediate stages in the manufacturing of FinFETs, in accordance with some other embodiments.

DETAILED DESCRIPTION

Figure 1:
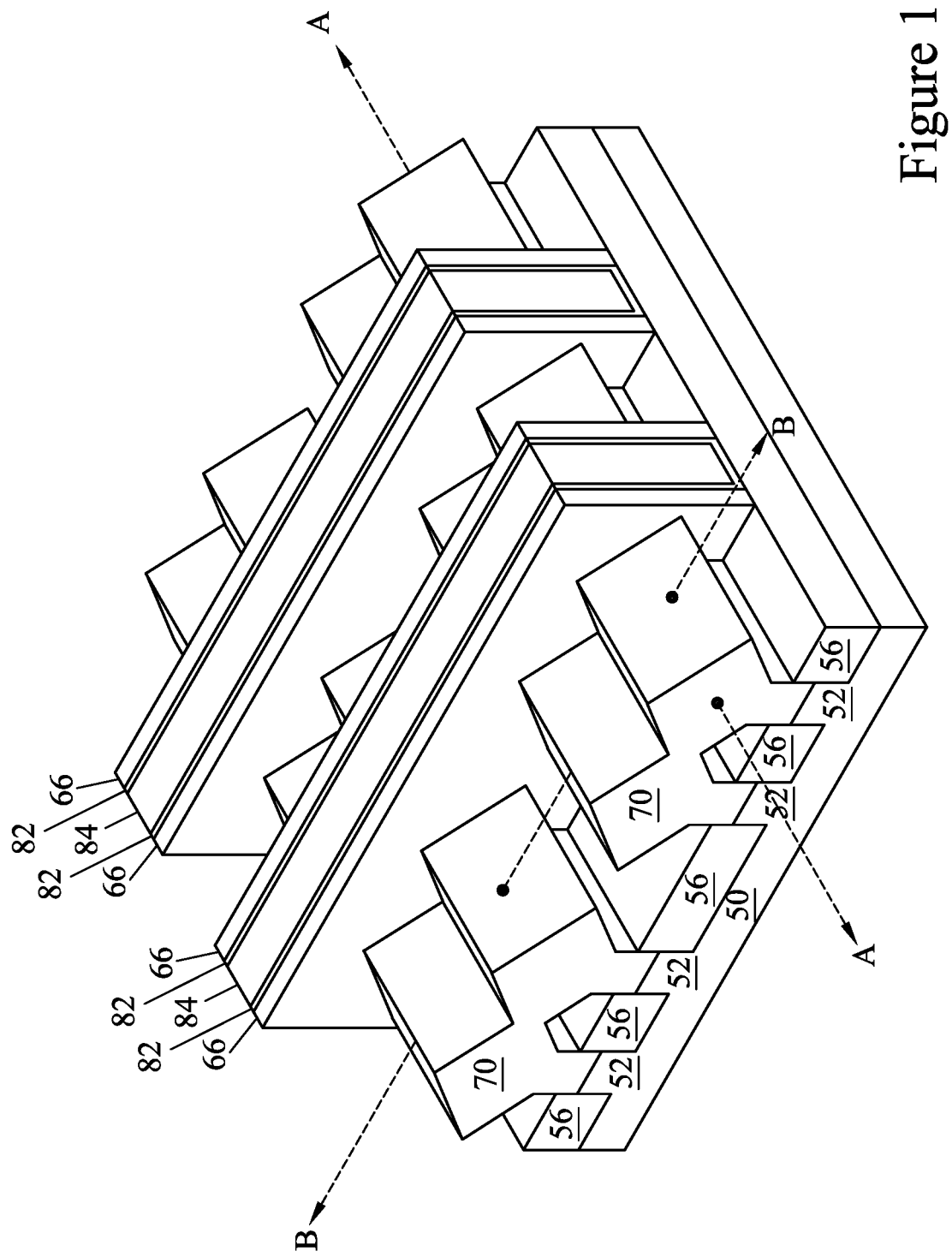
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a multi-layered epitaxial source/drain region is grown having an intermediate epitaxial layer that can be used as a semiconductor contact etch stop layer (CESL) during subsequent processing. The semiconductor CESL can be used to protect the underlying epitaxial layers and control etching losses during a subsequent source/drain contact formation process. Performance of the resulting FinFETs can thus be improved by increasing the contact area of the source/drain contacts, and by reducing etching losses of the epitaxial source/drain regions.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refer to the portions extending between the neighboring STI regions 56.

Gate dielectrics 82 are along sidewalls and over top surfaces of the fins 52, and gate electrodes 84 are over the gate dielectrics 82. Source/drain regions 70 are disposed in opposite sides of the fins 52 with respect to the gate dielectrics 82 and gate electrodes 84. Gate spacers 66 separate the source/drain regions 70 from the gate dielectrics 82 and gate electrodes 84. One or more inter-layer dielectric (ILD) layer(s) (not shown, discussed further below) are disposed over the source/drain regions 70 and gate electrodes 84, and contacts (not shown, discussed further below) to the source/drain regions 70 and gate electrodes 84 are formed through the ILD layer(s). In embodiments where multiple transistors are formed, the source/drain regions 70 may be shared between various transistors. In embodiments where one transistor is formed of multiple fins 52, neighboring source/drain regions 70 may be electrically connected, such as through coalescing the source/drain regions 70 by epitaxial growth, or through coupling the source/drain regions 70 with a same source/drain contact.

FIG. 1 further illustrates several reference cross-sections. Cross-section A-A is along a longitudinal axis of a fin 52 and in a direction of, for example, a current flow between the source/drain regions 70 of the FinFETs. Cross-section B-B is perpendicular to cross-section A-A and extends through the source/drain regions 70 of the FinFETs. Subsequent figures refer to these reference cross-sections for clarity.

Figure 2:
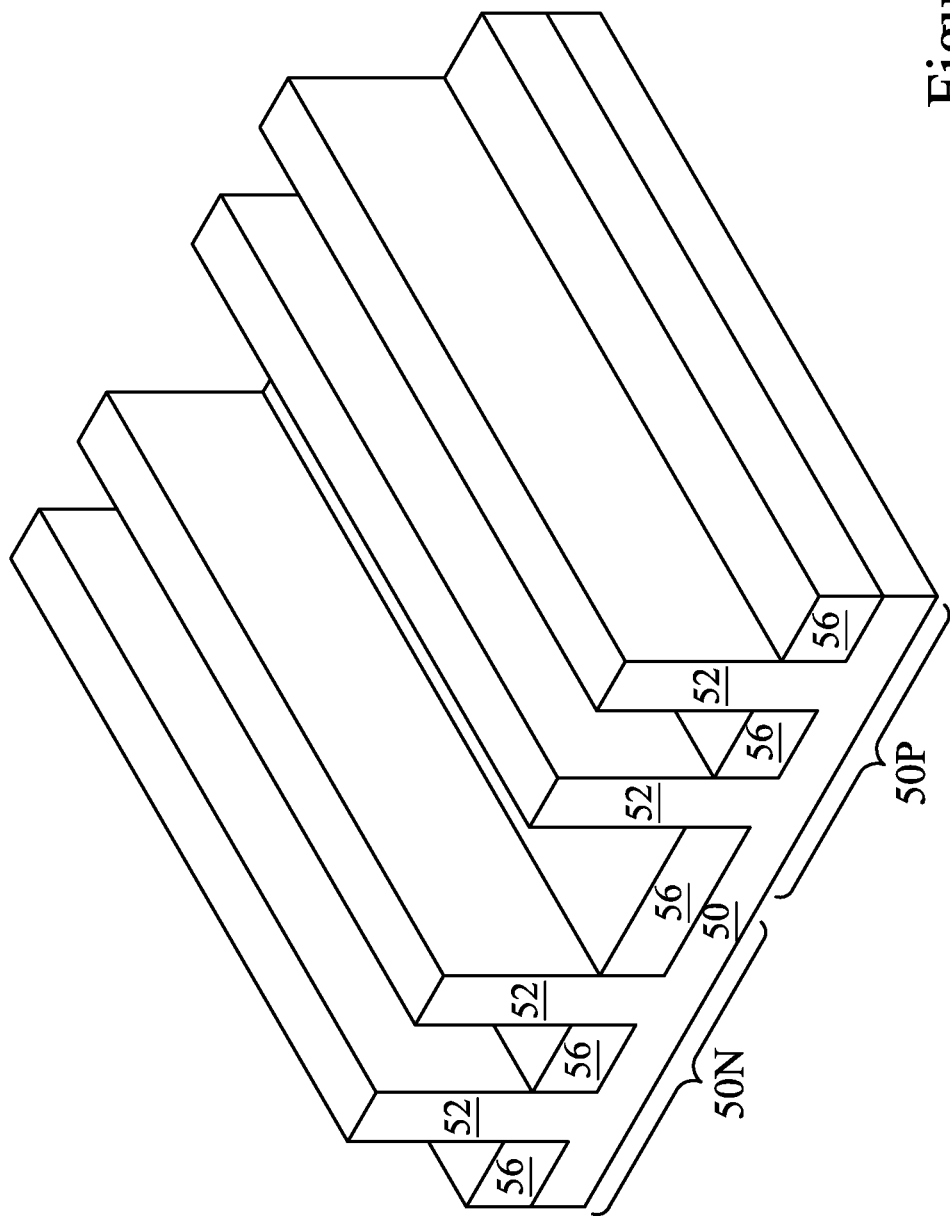
FIGS. 2 and 3 are three-dimensional views of intermediate stages in the manufacturing of FinFETs, in accordance with some embodiments.
Figure 3:
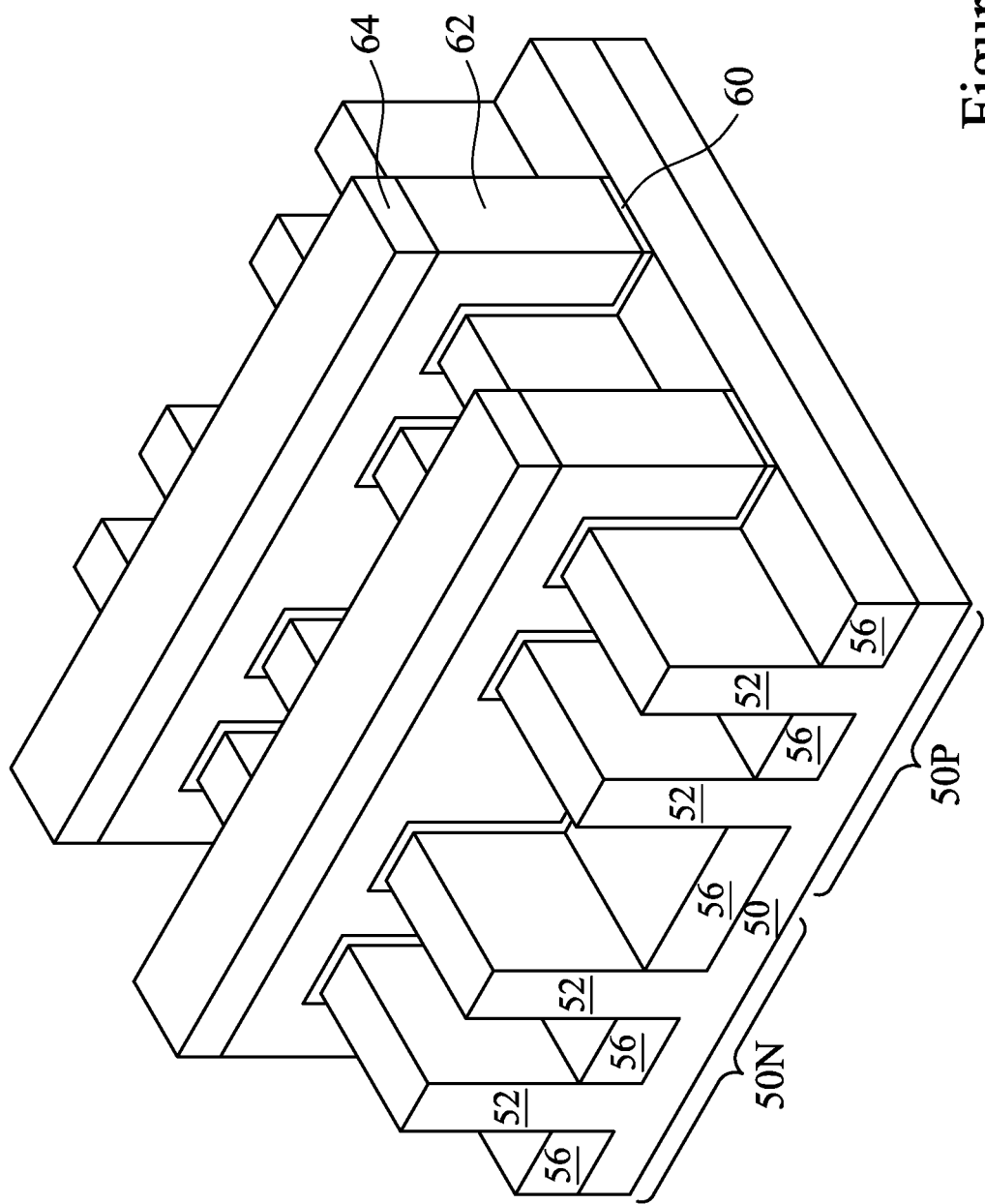

FIGS. 2 and 3 are three-dimensional views of intermediate stages in the manufacturing of FinFETs, in accordance with some embodiments. A substrate 50 is processed to form the FinFETs. The substrate 50 may be a semiconductor substrate, such as a bulk semiconductor, a semiconductor-on-insulator (SOI) substrate, or the like, which may be doped (e.g., with a p-type or a n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

In FIG. 2, fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process, such as a chemical mechanical polish (CMP), an etch back process, combinations thereof, or the like may be utilized. The planarization process exposes the fins 52 such that top surfaces of the fins 52 and the insulation material are planar after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend above top surfaces of the STI regions 56. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed of silicon germanium ($Si_xGe_{1-x}$) where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, a n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 60 are formed over the fins 52 and dummy gate electrodes 62 are formed over the dummy gate dielectrics 60. The dummy gate dielectrics 60 and dummy gate electrodes 62 may be collectively referred to as dummy gate stacks. The dummy gate stacks extend along sidewalls and top surfaces of the fins 52.

As an example of forming the dummy gate dielectrics 60 and dummy gate electrodes 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material such as amorphous silicon, polycrystalline-silicon (polysilicon), poly-crystalline silicon germanium (poly-SiGe), metallic nitrides, metallic silicides, metallic oxides, metals, or the like. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of the STI regions 56. The mask layer may include, for example, silicon nitride, silicon oxynitride, or the like. In this example, a single dummy gate layer and a single mask layer are formed across the region 50N and the region 50P. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form the dummy gate electrodes 62. The pattern of the masks 64 is further transferred to the dummy dielectric layer to form the dummy gate dielectrics 60. The dummy gate electrodes 62 cover respective channel regions 58 (see FIG. 4A) of the fins 52. The dummy gate electrodes 62 may also have a lengthwise direction substantially perpendicular (within process limitations) to the lengthwise direction of respective fins 52.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 4A through 12B are cross-sectional views of intermediate stages in the manufacturing of FinFETs, in accordance with some embodiments. FIGS. 4A, 5A, 6A, 7A, 8A, 9A, 10A, 11A, and 12A are cross-sectional views illustrated along reference cross-section A-A in FIG. 1, except only one source/drain region 70 is shown. FIGS. 4B, 5B, 6B, 7B, 8B, 9B, 10B, 11B and 12B are cross-sectional views illustrated along reference cross-section B-B in FIG. 1, except only two fins 52 are shown.

Figure 4B:
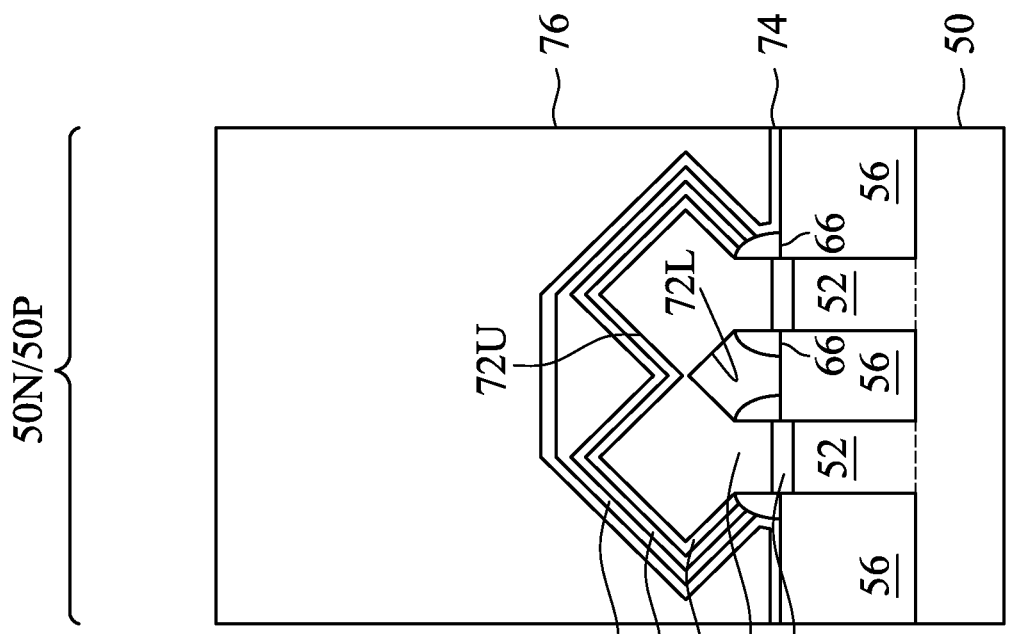
Figure 4A:
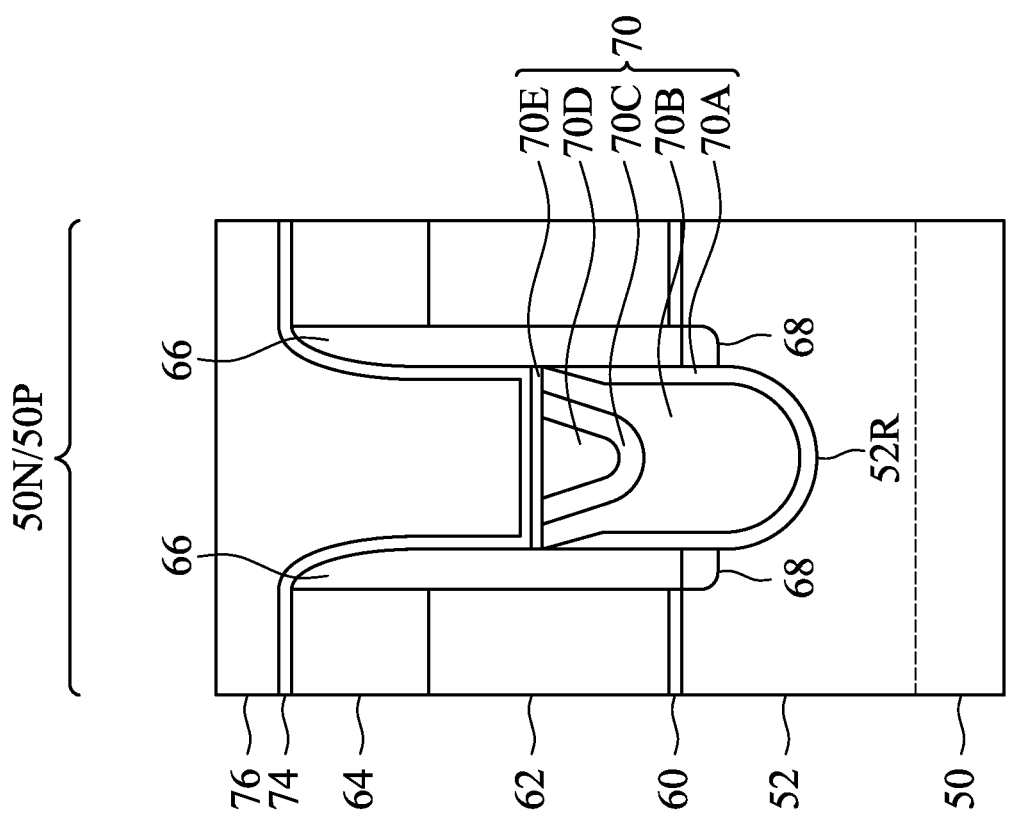

In FIGS. 4A and 4B, gate spacers 66 are formed on exposed surfaces of the dummy gate electrodes 62, the masks 64, and/or the fins 52. The gate spacers 66 may be formed by conformally depositing one or more layers of insulating material and subsequently etching the insulating material. The insulating material of the gate spacers 66 may be silicon nitride, silicon carbonitride, silicon oxycarbonitride, a combination thereof, or the like, and may be formed by a conformal deposition process, such as chemical vapor deposition (CVD), plasma enhanced chemical vapor deposition (PECVD), atomic layer deposition (ALD), or the like. In some embodiments, the gate spacers 66 are formed of one or more silicon oxycarbonitride layer(s), such as two silicon oxycarbonitride layers. Once formed, the insulating material can be etched by, e.g., a wet etch to form the gate spacers 66. The etching of the gate spacers 66 can be anisotropic. After etching, the gate spacers 66 can have curved sidewalls (as illustrated) or can have straight sidewalls (not illustrated).

Before or during the formation of the gate spacers 66, implants for lightly doped source/drain (LDD) regions 68 may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{16}$ cm$^{-3}$. An anneal may be used to activate the implanted impurities.

Epitaxial source/drain regions 70 are then formed in the fins 52. The epitaxial source/drain regions 70 are formed in the fins 52 such that each dummy gate electrode 62 is disposed between respective neighboring pairs of the epitaxial source/drain regions 70. The epitaxial source/drain regions 70 extend into, and may also penetrate through, the LDD regions 68. In some embodiments, the gate spacers 66 are used to offset the epitaxial source/drain regions 70 from the dummy gate electrodes 62 by an appropriate lateral distance so that the epitaxial source/drain regions 70 do not short out subsequently formed gates of the resulting FinFETs. The epitaxial source/drain regions 70 can be formed to exert stress in the respective channel regions 58, thereby improving performance.

The epitaxial source/drain regions 70 in the region 50N, e.g., the NMOS region, may be formed by masking the region 50P, e.g., the PMOS region, and etching source/drain regions of the fins 52 in the region 50N to form recesses 52R in the fins 52. Then, the epitaxial source/drain regions 70 in the region 50N are epitaxially grown in the recesses 52R. The epitaxial source/drain regions 70 in the region 50N may have faceted surfaces raised from respective surfaces of the fins 52 (discussed further below).

The epitaxial source/drain regions 70 in the region 50P, e.g., the PMOS region, may be formed by masking the region 50N, e.g., the NMOS region, and etching source/drain regions of the fins 52 in the region 50P to form recesses 52R in the fins 52. Then, the epitaxial source/drain regions 70 in the region 50P are epitaxially grown in the recesses 52R. The epitaxial source/drain regions 70 in the region 50P may also have faceted surfaces raised from respective surfaces of the fins 52 (discussed further below).

Each epitaxial source/drain region 70 includes functional layers 70A and 70B, a semiconductor CESL 70C, a dummy layer 70D, and (optionally) a finishing layer 70E, each of which is a semiconductor material layer grown by an acceptable epitaxial growth process. The functional layers 70A and 70B are formed of materials appropriate for the desired FinFETs, and are doped. Portions of the semiconductor CESL 70C and dummy layer 70D will be removed during subsequent processing, so that subsequently formed source/drain contacts can extend deep into the epitaxial source/drain region 70 and contact the functional layers 70B. The finishing layer 70E is a highly doped layer that protects the epitaxial source/drain region 70 from oxidation during the subsequent processing. Each of these layers is discussed further below.

The functional layers 70A and 70B are formed of any acceptable doped semiconductor material, such as appropriate for n-type or p-type FinFETs. For example, if the fins 52 in the region 50N are silicon, the functional layers 70A and 70B in the region 50N may include materials exerting a tensile strain in the channel regions 58, such as silicon, phosphorous doped silicon (e.g., silicon phosphide), silicon carbide, phosphorous doped silicon carbide, or the like. Likewise, if the fins 52 in the region 50P are silicon, the functional layers 70A and 70B in the region 50P may comprise materials exerting a compressive strain in the channel regions 58, such as silicon germanium, boron doped silicon germanium, germanium, germanium tin, or the like. The functional layers 70A and 70B are in situ doped during growth with n-type and/or p-type impurities to form source/drain regions. The n-type and/or p-type impurities for source/drain regions may be any of the impurities previously discussed. The functional layers 70A and 70B may be graded or ungraded, and may each include multiple sub-layers, such as from 2 to 4 sub-layers.

The functional layers 70A are grown along sidewalls of the recesses 52R, and the functional layers 70B are grown on the functional layers 70A. The functional layers 70A can also be referred to as liner layers, and the functional layers 70B can also be referred to as main layers. The functional layers 70A can be grown to a low dopant concentration and small thickness, which can promote adhesion to the fins 52. For example, the functional layers 70A can have a dopant concentration of less than about $10^{19}$ cm$^{-3}$, and a thickness in the range of about 1 nm to about 18 nm. The functional layers 70B can be grown to a high dopant concentration and large thickness, to provide sufficient majority carriers for the resulting FinFETs. For example, the functional layers 70B can have a dopant concentration in the range of about $10^{19}$ cm$^{-3}$ to about $10^{21}$ cm$^{-3}$, and a thickness in the range of about 10 nm to about 70 nm. In embodiments where the functional layers 70A and 70B include silicon germanium, the functional layers 70A can have a lesser concentration of germanium than the functional layers 70B, which can also promote adhesion to the fins 52. For example, the functional layers 70A can have a germanium concentration in the range of about 15 at. % to about 30 at. %, and the functional layers 70B can have a germanium concentration in the range of about 35 at. % to about 70 at. %.

Although two functional layers 70A and 70B are illustrated in each epitaxial source/drain region 70, it should be appreciated that the epitaxial source/drain regions 70 can include any number of functional layers. For example, more than two functional layers may be included in each epitaxial source/drain region 70. Likewise, liner layers may be omitted and only one functional layer (e.g., a main layer) may be included in each epitaxial source/drain region 70.

The semiconductor CESLs 70C and dummy layers 70D will be partially removed in subsequent processing, and can be undoped. During a subsequent contact etching process, the semiconductor CESLs 70C and dummy layers 70D will be etched to form recesses in the epitaxial source/drain regions 70. The semiconductor CESLs 70C and dummy layers 70D can be formed of different materials, and can be formed of different materials than the functional layers 70A and 70B and finishing layers 70E. The semiconductor CESLs 70C are formed of a material that has a high etching selectivity with the material of the dummy layers 70D and the gate spacers 66, relative the contact etching process. The semiconductor CESLs 70C thus protect underlying epitaxial layers during the subsequent contact etching process for removing the dummy layers 70D. The semiconductor CESLs 70C can be formed of an undoped semiconductor material, such as silicon, silicon nitride, silicon carbonitride, silicon oxycarbide, or silicon carbide. In some embodiments, the semiconductor CESLs 70C are formed of silicon and the dummy layers 70D are formed of silicon germanium, with the silicon being undoped and the silicon germanium having a high germanium concentration, such as a germanium concentration in the range of about 60 at. % to about 65 at. %. In some embodiments, the semiconductor CESLs 70C are formed of silicon and the dummy layers 70D are formed of aluminum oxide. The semiconductor CESLs 70C are sufficiently thick to provide protection to the underlying epitaxial layers. For example, the semiconductor CESLs 70C can have a thickness of at least 1 nm, such as a thickness in the range of about 1 nm to about 10 nm. The dummy layers 70D are sufficiently thick so that subsequently formed source/drain contacts can extend deep into the epitaxial source/drain regions 70 when the dummy layers 70D are etched. For example, the dummy layers 70D can have a thickness in the range of about 1 nm to about 10 nm.

The finishing layers 70E are formed of any acceptable material, such as appropriate for n-type or p-type FinFETs. The finishing layers 70E can be formed of similar materials as the underlying functional layers 70A and 70B. For example, the functional layers 70A and 70B and the finishing layers 70E in the region 50N can be formed of phosphorous doped silicon, and the functional layers 70A and 70B and the finishing layers 70E in the region 50P can be formed of boron doped silicon germanium. The finishing layers 70E are grown to a small thickness and low dopant concentration, which can help protect the underlying epitaxial layers from oxidation during a subsequent contact etching process. For example, the finishing layers 70E can have a dopant concentration of up to about $10^{21}$ cm$^{-3}$, and a thickness in the range of about 1 nm to about 20 nm. In embodiments where the finishing layers 70E include silicon germanium, the finishing layers 70E can have a lesser concentration of germanium than the functional layers 70B. For example, the finishing layers 70E can have a germanium concentration of up to about 35 at. %.

As a result of the epitaxy processes used to form the epitaxial source/drain regions 70 in the region 50N and the region 50P, upper surfaces of the epitaxial source/drain regions have facets which expand laterally outward beyond sidewalls of the fins 52. These facets cause some of the layers of adjacent epitaxial source/drain regions 70 of a same FinFET to merge. Specifically, adjacent functional layers 70B, semiconductor CESLs 70C, dummy layers 70D, and finishing layers 70E (when formed) merge. In the illustrated embodiments, the gate spacers 66 are formed covering a portion of the sidewalls of the fins 52 that extend above the STI regions 56, thereby blocking the epitaxial growth. In some other embodiments, the etch used to form the gate spacers 66 may be adjusted to remove the spacer material to allow the epitaxially grown region to extend to the surface of the STI regions 56.

The upper faceted surfaces of the functional layers 70B define upper basins 72U, which are laterally disposed between the fins 52. The lower faceted surfaces of the functional layers 70B define lower basins 72L, which are also laterally disposed between the fins 52. The lower basins 72L face toward the substrate 50, and the upper basins 72U face away from the substrate 50. The semiconductor CESLs 70C, dummy layers 70D, and finishing layers 70E are formed to fill the upper basins 72U. Specifically, the semiconductor CESLs 70C and dummy layers 70D are conformally formed in the upper basins 72U, and the finishing layers 70E (when present) fill remaining portions of the upper basins 72U. Some of the epitaxial layers may not be formed in the lower basins 72L. Specifically, the semiconductor CESLs 70C, dummy layers 70D, and finishing layers 70E are not formed in the lower basins 72L.

As an example to form the epitaxial source/drain regions 70 with the finishing layers 70E, a plurality of epitaxial growth steps and an etchback step can be performed. Specifically, the functional layers 70A are grown on sidewalls of the recesses 52R, the functional layers 70B are grown on the functional layers 70A, the semiconductor CESLs 70C are grown on the functional layers 70B, and the dummy layers 70D are grown on the semiconductor CESLs 70C. An etchback process is then performed to level the top surfaces of the layers 70B, 70C, 70D. After the etchback process, the finishing layers 70E are grown on the leveled surfaces of the layers 70B, 70C, 70D. The finishing layers 70E can thus cover the underlying layers 70B, 70C, 70D, and can fill the upper basins 72U so that the final top surfaces of the epitaxial source/drain regions 70 are flat or concave.

Because the epitaxial layers are grown in the recesses 52R, they have a conformal shape in the cross-section shown in FIG. 4A (e.g., in a plane extending parallel to the fins 52). However, because the surfaces of the epitaxial source/drain region 70 are faceted, the epitaxial layers are raised from respective surfaces of the fins 52 in the cross-section shown in FIG. 4B (e.g., in a plane extending perpendicular to the fins 52). For example, the semiconductor CESLs 70C and dummy layers 70D are grown such that they extend over the topmost surfaces of the functional layers 70B in the cross-section shown in FIG. 4B, but not in the cross-section shown in FIG. 4A. It should be appreciated that a feature which does not extend through an epitaxial layer in one cross-section may nonetheless extend through that epitaxial layer in another cross-section.

A first ILD layer 76 is then deposited over the various features. The first ILD layer 76 may be formed of a dielectric material, and may be deposited by any suitable method, such as CVD, plasma-enhanced CVD (PECVD), or FCVD. Dielectric materials may include a silicate glass such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a dielectric CESL 74 is disposed between the first ILD layer 76 and the epitaxial source/drain regions 70, the gate spacers 66, and the masks 64. The dielectric CESL 74 may be formed of a dielectric material, such as silicon nitride, silicon oxide, silicon oxynitride, aluminum oxide, or the like, having a different etch rate than the material of the overlying first ILD layer 76, and may be formed by a suitable deposition process.

Figure 5A:
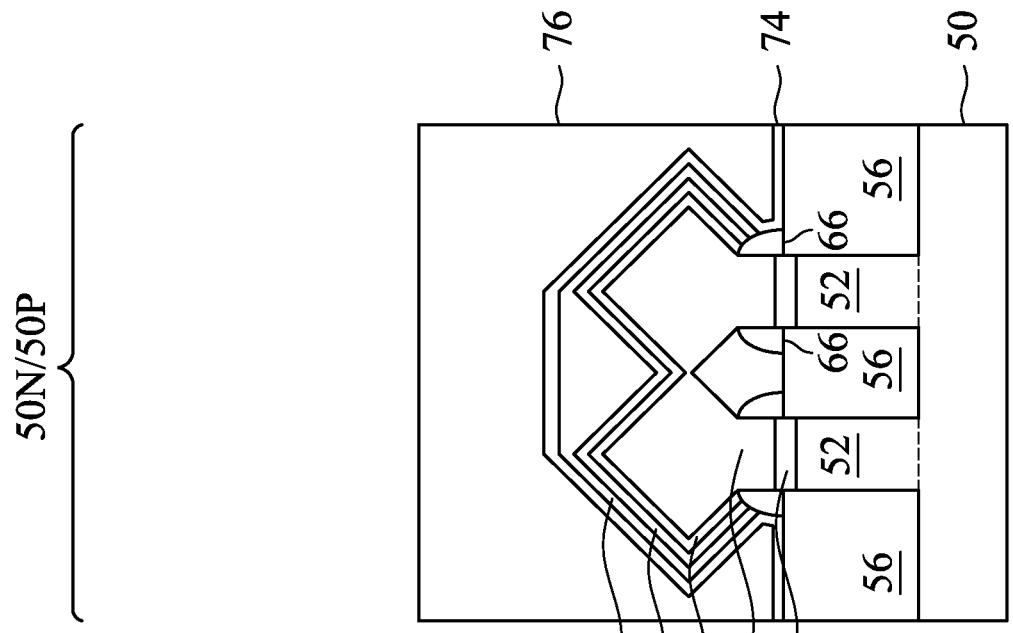
Figure 5B:
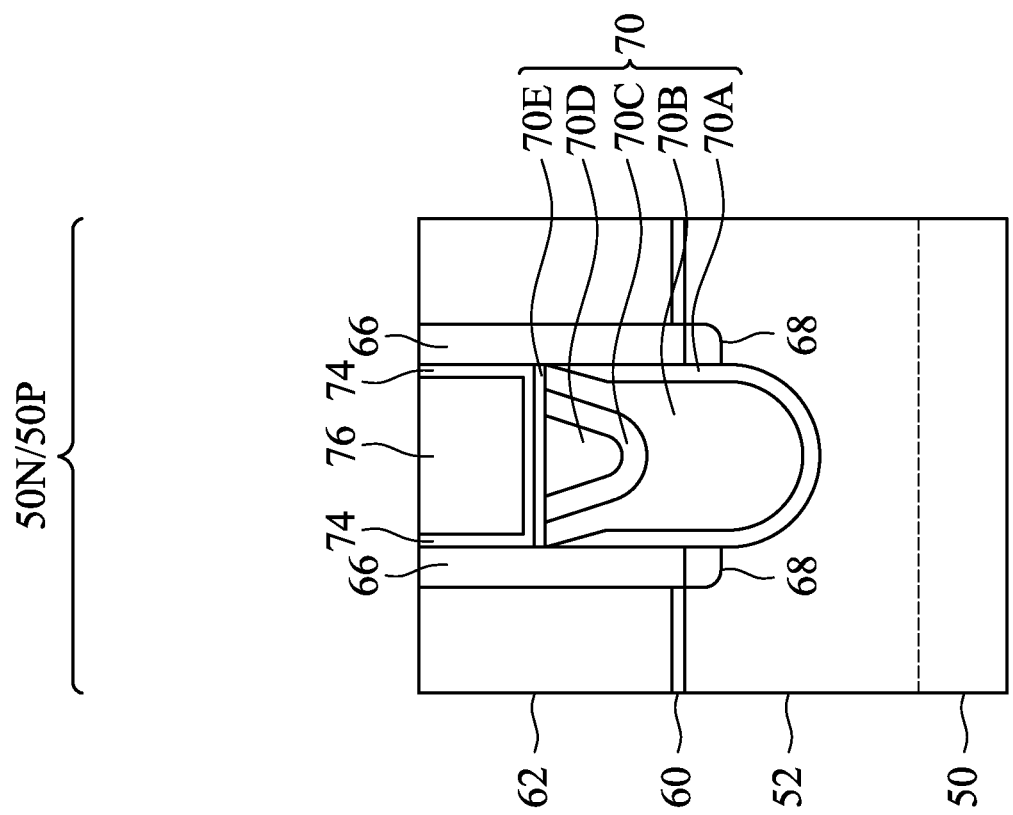

In FIGS. 5A and 5B, a planarization process, such as a CMP, may be performed to level the top surface of the first ILD layer 76 with the top surfaces of the dummy gate electrodes 62 or the masks 64. The planarization process may also remove the masks 64 on the dummy gate electrodes 62, and portions of the gate spacers 66 along sidewalls of the masks 64. After the planarization process, top surfaces of the dummy gate electrodes 62, the gate spacers 66, and the first ILD layer 76 are planar. Accordingly, the top surfaces of the dummy gate electrodes 62 are exposed through the first ILD layer 76. In some embodiments, the masks 64 may remain, in which case the planarization process levels the top surface of the first ILD layer 76 with the top surfaces of the top surface of the masks 64.

Figures 6A, 6B:
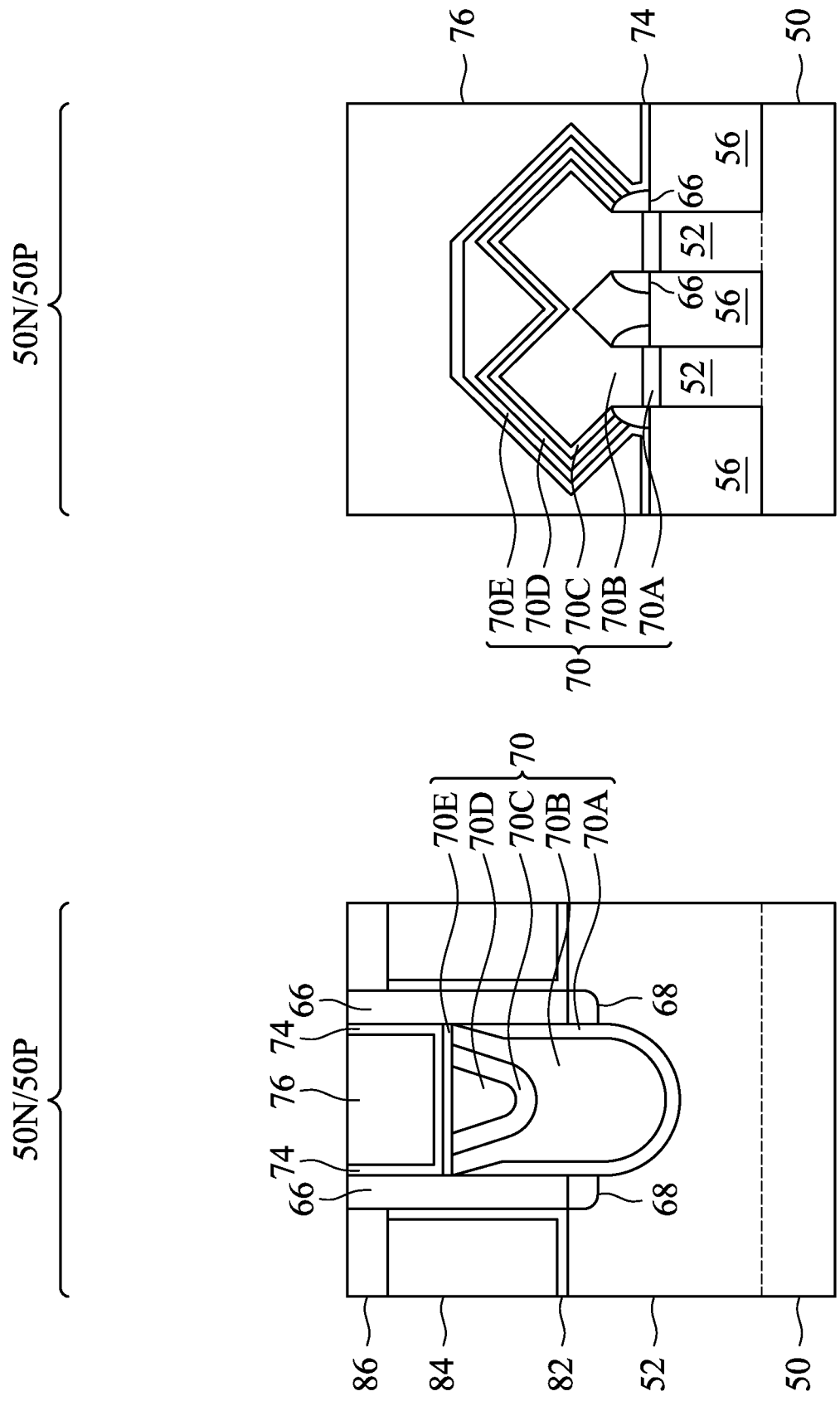

In FIGS. 6A and 6B, the dummy gate electrodes 62 and optionally the dummy gate dielectrics 60 are removed and are replaced with replacement gates. The replacement gates include gate dielectrics 82 and gate electrodes 84. The replacement gates may also be referred to as "gate stacks" or "metal gates." The replacement gates extend along sidewalls of the channel regions 58 of the fins 52.

As an example to form the replacement gates, the dummy gate electrodes 62, and the masks 64 if present, are removed in one or more etching step(s), so that recesses are formed. Portions of the dummy gate dielectrics 60 in the recesses may also be removed. In some embodiments (not shown), only the dummy gate electrodes 62 are removed and the dummy gate dielectrics 60 remain and are exposed by the recesses. For example, the dummy gate dielectrics 60 can be removed from recesses in a first region of a die (e.g., a core logic region) and remain in recesses in a second region of the die (e.g., an input/output region). In some embodiments, the dummy gate electrodes 62 are removed by an anisotropic dry etch process. For example, the etching process may include a dry etch process using reaction gas(es) that selectively remove the material of the dummy gate electrodes 62 at a greater rate than the materials of the first ILD layer 76 and gate spacers 66. The recesses expose the fins 52. Specifically, the channel regions 58 are exposed by the recesses. Each channel region 58 is disposed between neighboring pairs of the epitaxial source/drain regions 70. During the removal, the dummy gate dielectrics 60 may be used as etch stop layers when the dummy gate electrodes 62 are etched. The dummy gate dielectrics 60 may then be optionally removed after the removal of the dummy gate electrodes 62. After the removal, the gate dielectrics 82 are deposited conformally in the recesses, such as on the top surfaces and the sidewalls of the fins 52 and on sidewalls of the gate spacers 66. The gate dielectrics 82 may also be formed on top surface of the first ILD layer 76. In some embodiments, the gate dielectrics 82 comprise silicon oxide, silicon nitride, or multilayers thereof. In some embodiments, the gate dielectrics 82 include a high-k dielectric material, and in these embodiments, the gate dielectrics 82 may have a k value greater than about 7.0, and may include a metal oxide or a silicate of Hf, Al, Zr, La, Mg, Ba, Ti, Pb, and combinations thereof. The formation methods of the gate dielectrics 82 may include Molecular-Beam Deposition (MBD), atomic layer deposition (ALD), PECVD, and the like. In embodiments where portions of the dummy gate dielectrics 60 remain in the recesses, the gate dielectrics 82 include a material of the dummy gate dielectrics 60 (e.g., silicon oxide). The gate electrodes 84 are deposited over the gate dielectrics 82, respectively, and fill the remaining portions of the recesses. The gate electrodes 84 may include a metal-containing material, such as TiN, TiO, TaN, TaC, Co, Ru, Al, W, combinations thereof, or multi-layers thereof. For example, although a single-layered gate electrode 84 is illustrated, each gate electrode 84 may comprise any number of liner layers, any number of work function tuning layers, and a fill material. After the filling of the gate electrodes 84, a planarization process, such as a CMP, may be performed to remove the excess portions of the gate dielectrics 82 and the material of the gate electrodes 84, which excess portions are over the top surface of the first ILD layer 76. The remaining portions of material of the gate dielectrics 82 and gate electrodes 84 thus form the replacement gates of the resulting FinFETs.

Gate masks 86 are then formed over the replacement gates. The replacement gates (e.g., gate dielectrics 82 and gate electrodes 84) can be recessed, and one or more layers of dielectric material, such as silicon nitride, silicon oxynitride, or the like, can be filled in the recesses. A planarization process can be performed to remove excess portions of the dielectric material extending over the first ILD layer 76. The gate masks 86 comprise portions of the dielectric material remaining in the recesses.

Figures 7A, 7B:
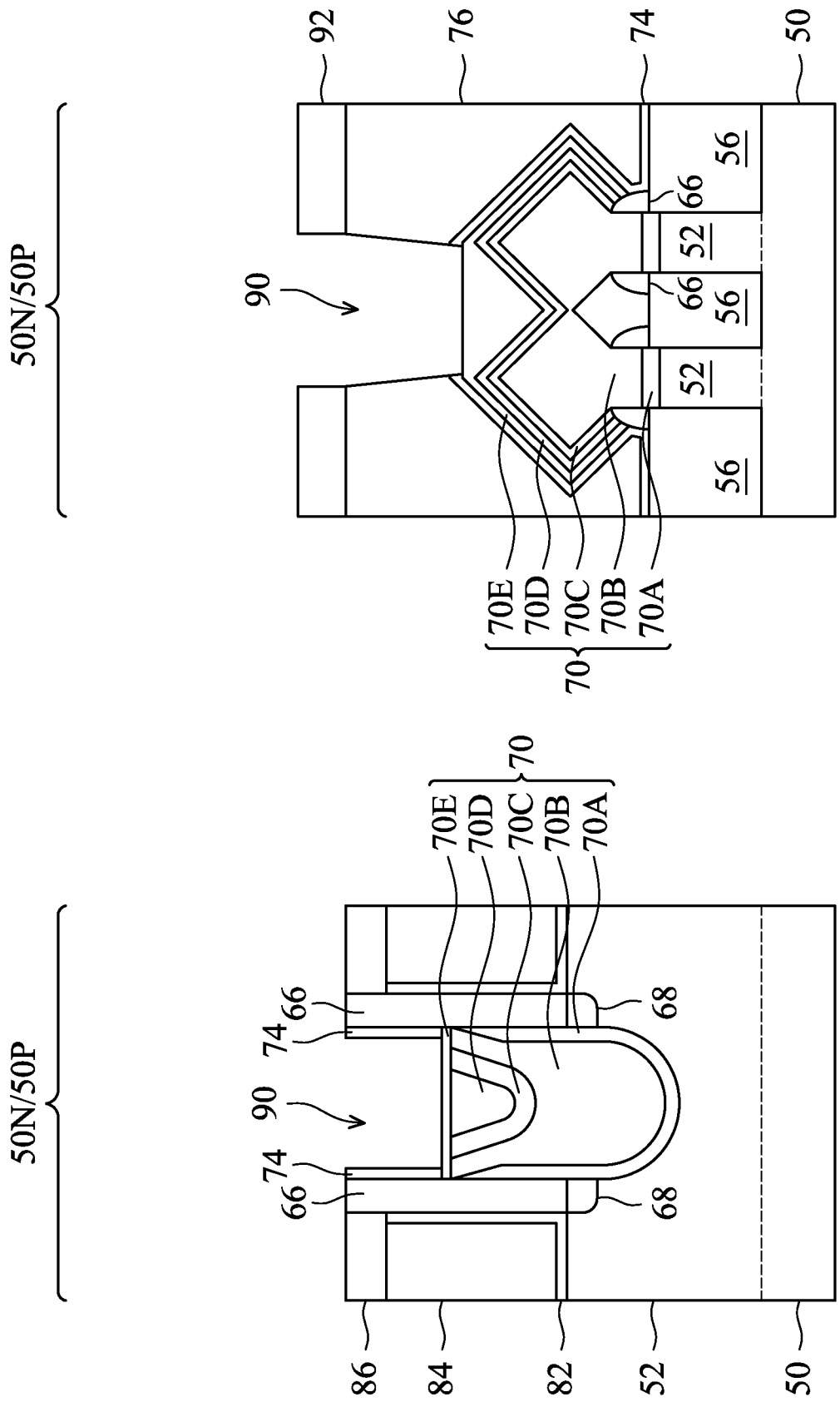

In FIGS. 7A and 7B, portions of the first ILD layer 76 and dielectric CESL 74 are removed to form contact openings 90. The contact openings 90 expose the epitaxial source/drain regions 70, e.g., the finishing layers 70E. An acceptable etch process that is selective to the first ILD layer 76 and does not remove the gate spacers 66 or gate masks 86 can be performed to form the contact openings 90. Another etch process may then be performed to remove the dielectric CESL 74. In some embodiments, the removal is an anisotropic etch, and residual vertical portions of the dielectric CESL 74 remain along the gate spacers 66. In some embodiments, small residual horizontal portions of the dielectric CESL 74 can remain along the functional layers 70B. Such residual horizontal portions (not shown) can have a small width, such as a width of less than 1 nm, and can protect the functional layers 70B during a subsequent etch (discussed with respect to FIGS. 8A and 8B).

The etch process(es) can be performed with an etching mask 92, such as a photoresist, that has a pattern of the contact openings 90. In this embodiment, the etching mask 92 has a pattern of slot openings. The slot openings are strips that run perpendicular to and overlap the gate electrodes 84, and run parallel to and overlap the fins 52. As such, all of the first ILD layer 76 in the cross-section shown in FIG. 7A is removed to form the contact openings 90. In other embodiments (discussed further below), the etching mask 92 can have other types of openings, resulting in contact openings 90 of different dimensions. After the etch process(es), the etching mask 92 may be removed, such as by an acceptable ashing process.

Figure 8B:
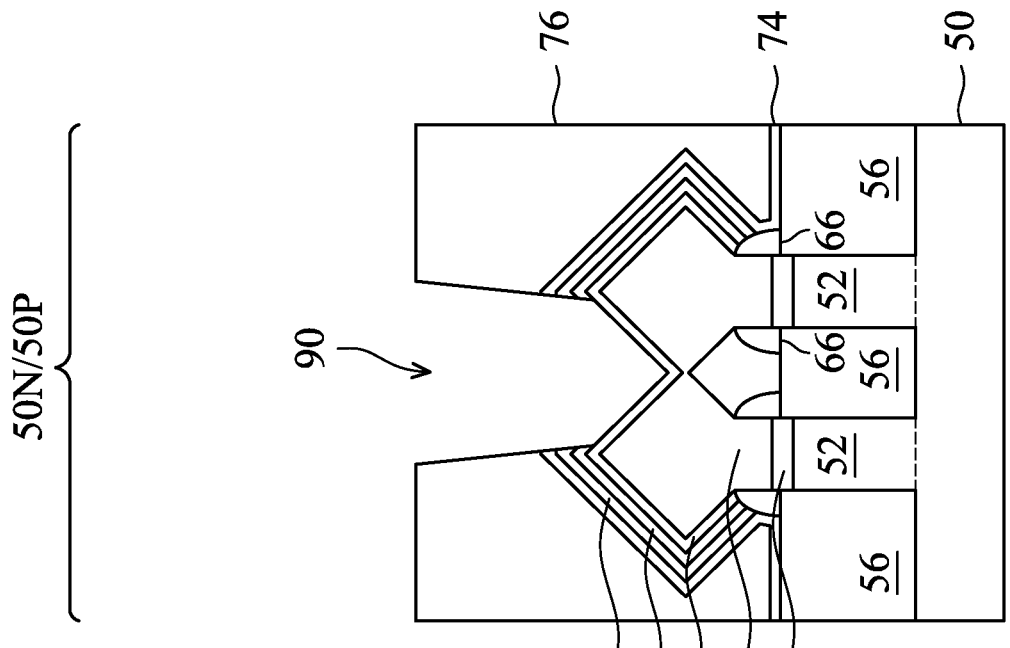
Figure 8A:
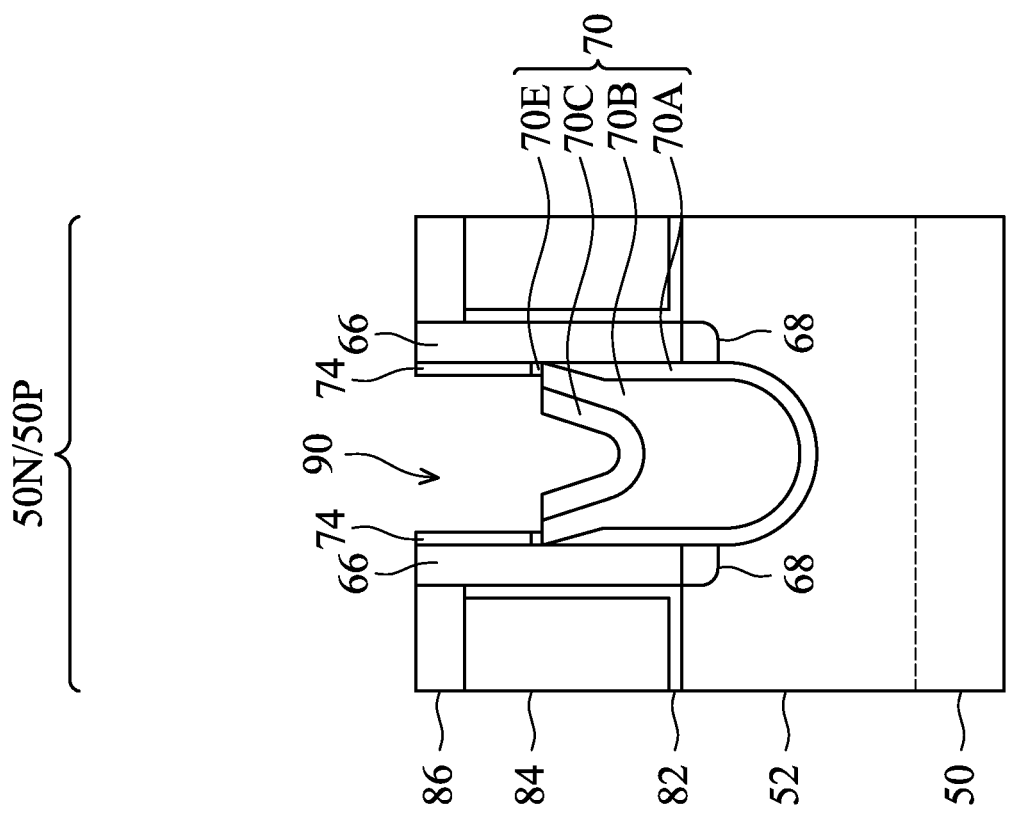

In FIGS. 8A and 8B, exposed portions of the finishing layers 70E are removed to expose portions of the dummy layers 70D. The exposed portions of the dummy layers 70D are then removed to expose portions of the semiconductor CESLs 70C. The contact openings 90 are thus enlarged. The removal can be by one or more etching step(s). The etching may be any acceptable etch process that is selective to the dummy layers 70D and finishing layers 70E, e.g., etches the material of the dummy layers 70D and finishing layers 70E at a greater rate than the material of the semiconductor CESLs 70C. For example, the etch rate of the material of the dummy layers 70D and finishing layers 70E can be from about 10 to about 2000 times greater than the etch rate of the material of the semiconductor CESLs 70C relative the etching process. The etching process can be anisotropic.

In embodiments where the semiconductor CESLs 70C are formed of silicon and the dummy layers 70D are formed of silicon germanium, the etching process can be an anisotropic wet etch performed with one of several etching solutions. In some embodiments, the etching solution is a mixture of HCl, $H_2O_2$, and water. In some embodiments, the etching solution is a mixture of deionized water (DIW) and ozone, e.g., ozonated DIW. In some embodiments, the etching solution is a mixture of $H_2SO_4$ and $H_2O_2$. In such embodiments, the etching process can be performed for a duration in the range of about 5 seconds to about 300 seconds.

In embodiments where the semiconductor CESLs 70C are formed of silicon and the dummy layers 70D are formed of aluminum oxide, the etching process can be an anisotropic wet etch performed with ammonia ($NH_3$). In such embodiments, the etching process can be performed for a duration in the range of about 5 seconds to about 200 seconds.

Figure 9B:
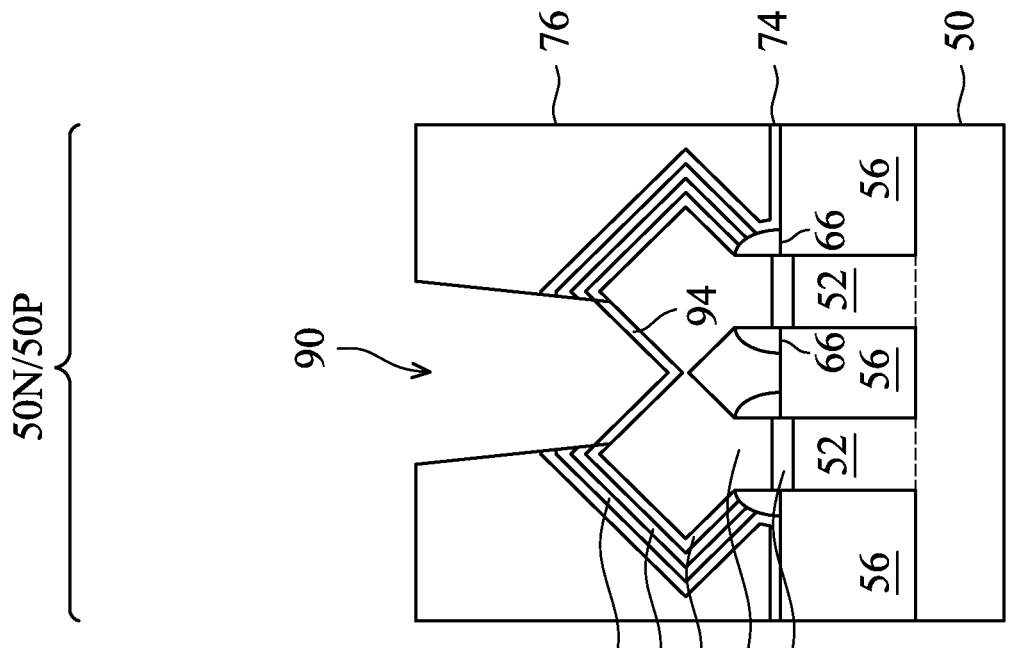
Figure 9A:
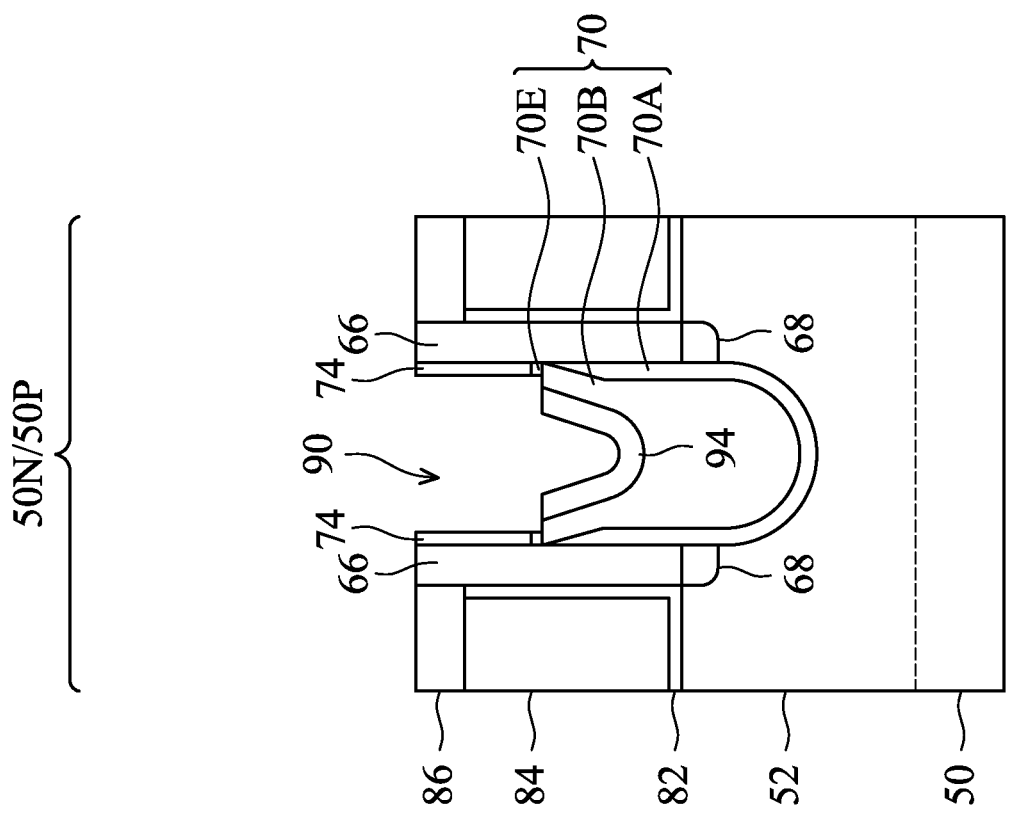

In FIGS. 9A and 9B, the exposed portions of the semiconductor CESLs 70C in the contact openings 90 are oxidized to form dielectric layers 94. In embodiments where the semiconductor CESLs 70C are silicon, the dielectric layers 94 can be silicon oxide. Unexposed portions of the semiconductor CESLs 70C, such as portions not exposed by the contact openings 90, are not oxidized. In some embodiment, the oxidation can be by natural oxidation, such as by exposing the structure to an oxygen-containing atmosphere. In some embodiment, the oxidation can be by a wet oxygen treatment process, such as by exposing the structure to ozonated deionized water or hydrogen peroxide. In some embodiment, the oxidation can be by a dry oxygen treatment process, such as by exposing the structure to oxygen gas at a high temperature, such as a temperature in the range of about 80° C. to about 500° C. A dry oxygen treatment process can be performed with a plasma to damage the surface of the semiconductor CESLs 70C and thus accelerate oxidation. For example, a plasma can be generated with argon and oxygen during the dry oxygen treatment process.

Figure 10B:
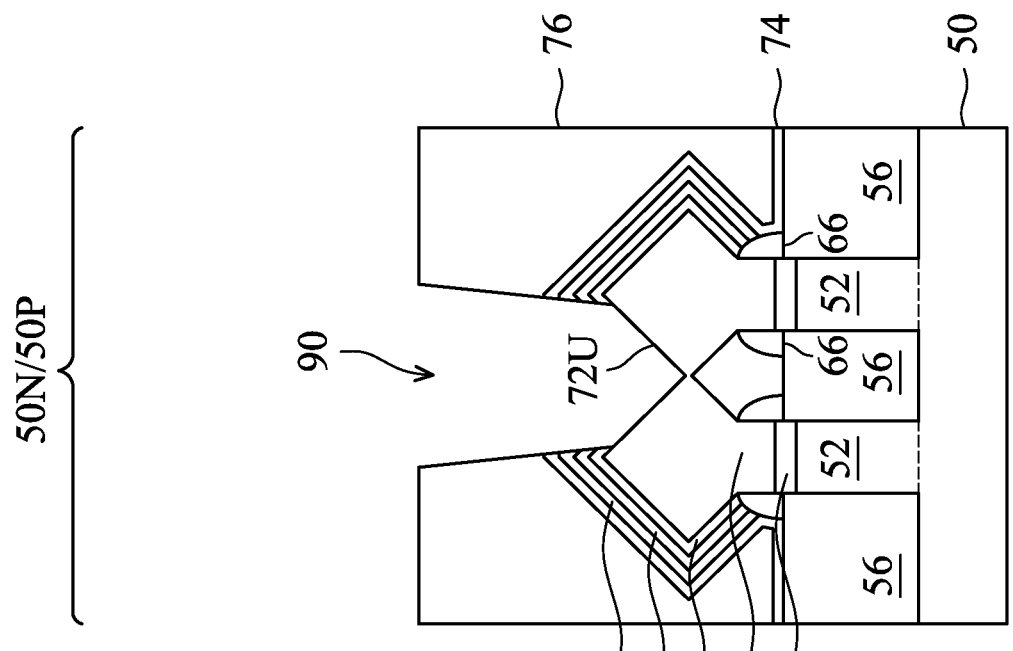
Figure 10A:
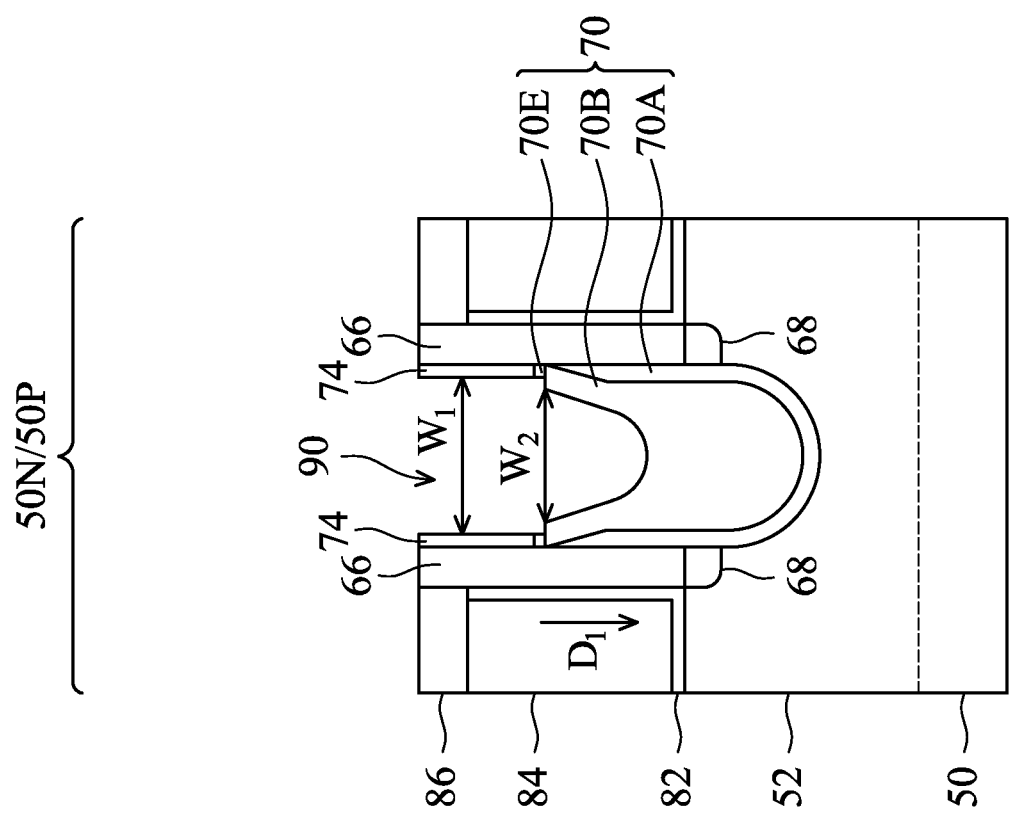

In FIGS. 10A and 10B, the dielectric layers 94 are removed so that the contact openings 90 are enlarged. After the removal, portions of the functional layers 70B are exposed, and in particular, the upper basins 72U are exposed. Source/drain contacts will subsequently be formed in the upper basins 72U, thus allowing the source/drain contacts to contact a large surface area of the functional layers 70B, which can reduce the resistance of the source/drain contacts. By exposing the upper basins 72U with the use of an additional CESL (e.g., the semiconductor CESLs 70C), the amount of etching losses of the functional layers 70B can be reduced. The functional layers 70B have a high dopant concentration, and so reducing their losses can increase the performance of the resulting FinFETs. Further, the use of timed etches can be avoided, thereby avoiding both over-etching of the functional layers 70B and under-etching of the dielectric CESL 74.

The dielectric layers 94 can be removed by any acceptable oxide removal or cleaning process. In embodiments where the dielectric layers 94 are silicon oxide, the oxide removal process is a wet or dry etch performed with nitrogen trifluoride ($NF_3$), ammonia ($NH_3$), dilute hydrofluoric (dHF) acid, a fluorocarbon (e.g., fluoromethane ($CH_3F$), tetrafluoromethane ($CF_4$), or the like), or a combination thereof. For example, the etch can be a wet etch performed with dHF for a duration in the range of about 10 seconds to about 30 seconds. The etch does not remove the unoxidized portions of the semiconductor CESLs 70C. The etching is selective to the dielectric layers 94, e.g., etches the material of the dielectric layers 94 at a greater rate than the material of the functional layers 70B. For example, the etch rate of the material of the dielectric layers 94 can be from about 10 to about 2000 times greater than the etch rate of the material of the functional layers 70B relative the etching process.

After the etching, upper portions of the contact openings 90 (e.g., portions extending through the dielectric CESL 74 and first ILD layer 76) have a width $W_1$, which can be in the range of about 8 nm and about 20 nm, and lower portions of the contact openings 90 (e.g., portions extending through the dummy layers 70D and into the epitaxial source/drain regions 70) have a width $W_2$, which can be in the range of about 6 nm and about 19 nm. The width $W_1$ is greater than the width $W_2$. For example, the width $W_1$ can be greater than the width $W_2$ by from about 3 nm to about 4 nm, and the ratio of $W_1:W_2$ can be in the range of about 1 to about 1.5. The width $W_1$ and $W_2$ are measured in the cross-section shown in FIG. 10A, although the first ILD layer 76 and dummy layers 70D are illustrated in the cross-section shown in FIG. 10B. Due to the conformal nature of epitaxy, the semiconductor CESLs 70C and dummy layers 70D (see FIGS. 4A and 4B) can have a continually decreasing width in a direction $D_1$ extending from the top surfaces of the epitaxial source/drain regions 70 towards the bottom surfaces of the epitaxial source/drain regions 70. In other words, the width $W_2$ can continually decrease in the direction $D_1$.

In FIGS. 11A and 11B, lower source/drain contacts 98 are formed in the contact openings 90. A liner, such as a diffusion barrier layer, an adhesion layer, or the like, and a conductive material is formed in the contact openings 90. The liner may include titanium, titanium nitride, tantalum, tantalum nitride, or the like. The conductive material may be cobalt, tungsten, ruthenium, aluminum, copper, silver, gold, nickel, or the like, and may be formed by deposition, plating, or the like. A planarization process, such as a CMP, may be performed to remove excess material from the top surface of the first ILD layer 76. The remaining liner and conductive material form the lower source/drain contacts 98. The lower source/drain contacts 98 are physically and electrically coupled to the epitaxial source/drain regions 70. After formation, upper portions of the lower source/drain contacts 98 are surrounded by the dielectric CESL 74, middle portions of the lower source/drain contacts 98 are surrounded by the finishing layers 70E, and lower portions of the lower source/drain contacts 98 are surrounded by the functional layers 70B. Silicides 96 may be disposed between the epitaxial source/drain regions 70 and the lower source/drain contacts 98. The silicides 96 may be formed by depositing a conductive material in the contact openings 90 and performing an anneal. The conductive material can be cobalt, titanium, titanium nitride, nickel, the like, or combinations thereof. After annealing, the silicides 96 can comprise $TiSi_2$, $CoSi_2$, or the like. The silicides 96 can contact sidewalls of the remaining portions of the finishing layers 70E.

In FIGS. 12A and 12B, a second ILD layer 102 is deposited over the first ILD layer 76. In some embodiment, the second ILD layer 102 is a flowable film formed by a flowable CVD method. In some embodiments, the second ILD layer 102 is formed of a dielectric material, such as PSG, BSG, BPSG, USG, or the like, and may be deposited by any suitable method, such as CVD and PECVD. An etch stop layer 100 is disposed between the second ILD layer 102 and the lower source/drain contacts 98, gate masks 86, gate spacers 66, and dielectric CESL 74. The etch stop layer 100 may be formed of a dielectric material, such as, silicon nitride, silicon oxide, silicon oxynitride, aluminum oxide, or the like, having a different etch rate than the material of the overlying second ILD layer 102, and may be formed by a suitable deposition process.

Upper source/drain contacts 104 and gate contacts 106 are then formed. Openings for the upper source/drain contacts 104 are formed through the second ILD layer 102 and etch stop layer 100, and openings for the gate contacts 106 are formed through the second ILD layer 102, etch stop layer 100, and gate masks 86. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, silver, gold, tungsten, cobalt, aluminum, nickel, or the like. A planarization process, such as a CMP, may be performed to remove excess material from a top surface of the second ILD layer 102. The remaining liner and conductive material form the upper source/drain contacts 104 and gate contacts 106 in the openings. The upper source/drain contacts 104 are physically and electrically coupled to the lower source/drain contacts 98, and the gate contacts 106 are physically and electrically coupled to the gate electrodes 84. The upper source/drain contacts 104 and gate contacts 106 may be formed in different processes, or may be formed in the same process. Although shown as being formed in the same cross-sections, it should be appreciated that each of the upper source/drain contacts 104 and gate contacts 106 may be formed in different cross-sections, which may avoid shorting of the contacts.

As noted above, the finishing layers 70E and/or dummy layers 70D may (or may not) be formed beneath the epitaxial source/drain regions 70 (not separately illustrated). In some embodiments, the finishing layers 70E are not formed beneath the epitaxial source/drain regions 70, but the dummy layers 70D are. In some embodiments, both the finishing layers 70E and dummy layers 70D are not formed beneath the epitaxial source/drain regions 70.

FIGS. 13A through 16B are cross-sectional views of intermediate stages in the manufacturing of FinFETs, in accordance with some other embodiments. FIGS. 13A, 14A, 15A, and 16A are cross-sectional views illustrated along reference cross-section A-A in FIG. 1, except only one source/drain region 70 is shown. FIGS. 13B, 14B, 15B, and 16B are cross-sectional views illustrated along reference cross-section B-B in FIG. 1, except only two fins 52 are shown.

Figure 13B:
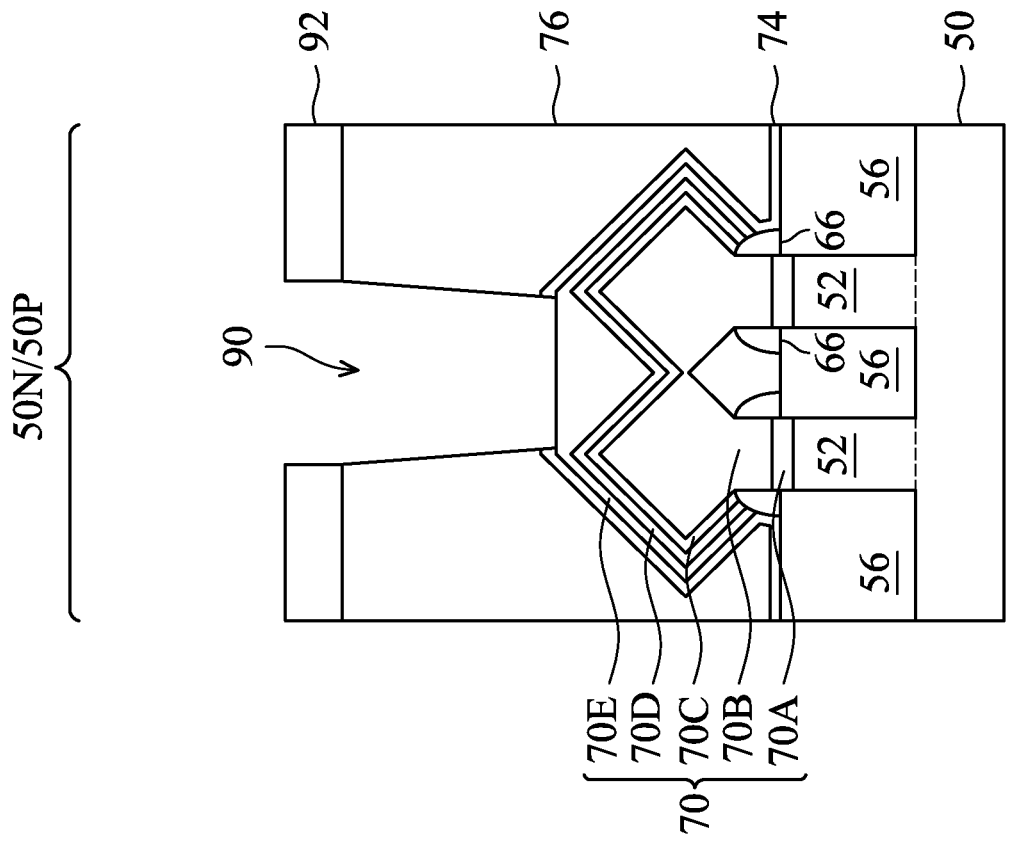
FIGS. 13A through 16B are cross-sectional views of intermediate stages in the manufacturing of FinFETs, in accordance with some other embodiments.
Figure 13A:
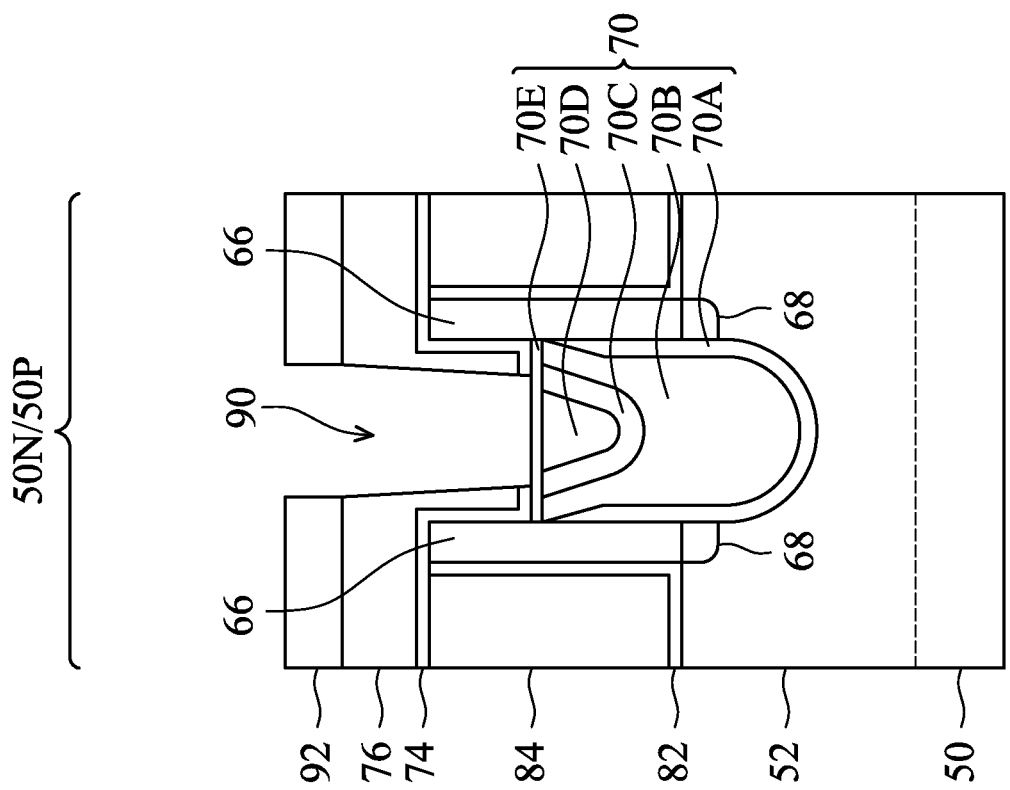

In FIGS. 13A and 13B, an intermediate structure similar to that of FIGS. 6A and 6B is obtained, except the gate masks 86 are omitted, and the planarization process on the first ILD layer 76 (discussed with respect to FIGS. 5A and 5B) is also omitted. Thus, the dielectric CESL 74 and first ILD layer 76 have portions disposed over the gate electrodes 84. Portions of the first ILD layer 76 and dielectric CESL 74 are removed to form the contact openings 90. Removal may be by acceptable photolithography and etching techniques, using the etching mask 92. In this embodiment, the etching mask 92 has a pattern of bounded openings (e.g., non-slot openings). The bounded openings are bounded on all sides by the material of the etching mask 92. As such, some of the first ILD layer 76 in the cross-section shown in FIG. 13A can remain after forming the contact openings 90. The lower source/drain contacts 98 can thus be formed to a smaller width between adjacent gate electrodes 84, decreasing the parasitic capacitance between the gate electrodes 84 and lower source/drain contacts 98.

Figure 14B:
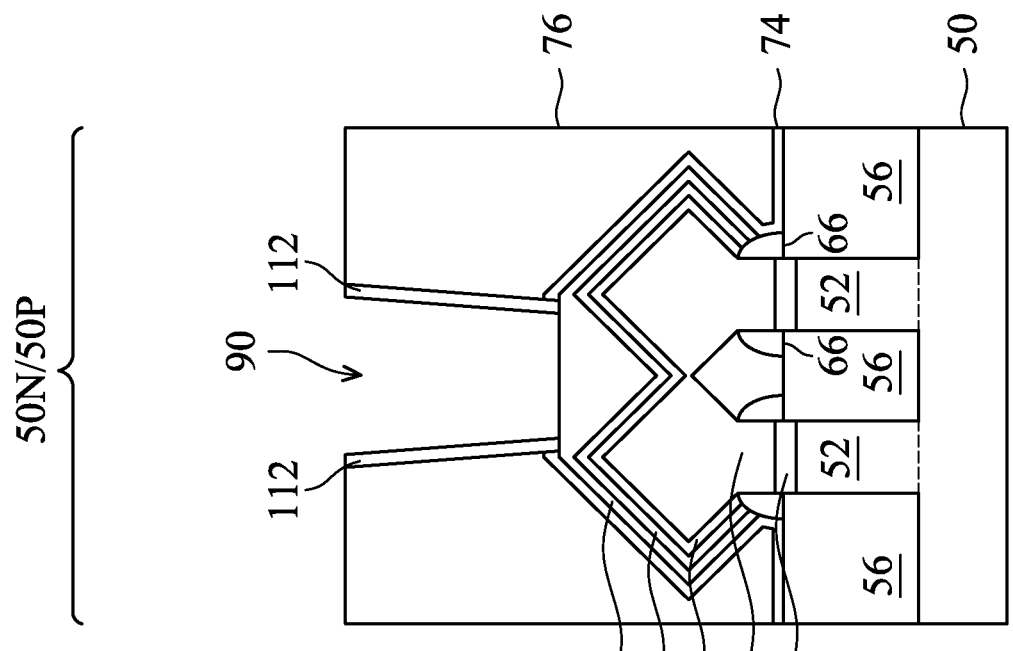
Figure 14A:
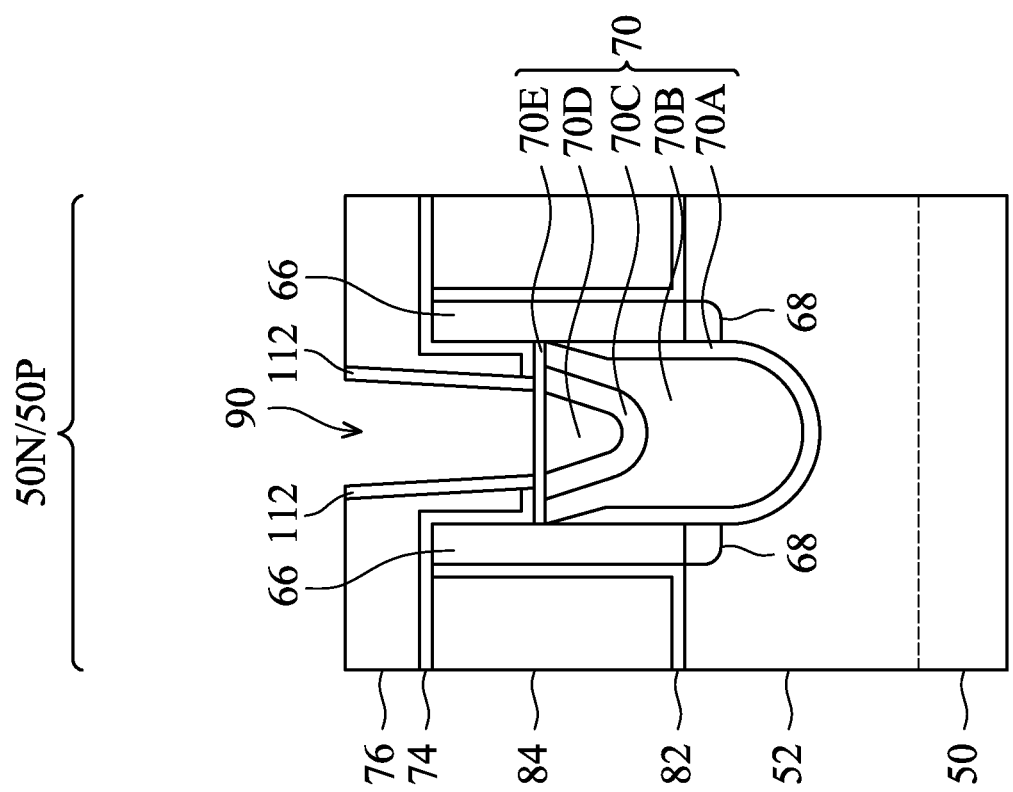

In FIGS. 14A and 14B, contact spacers 112 are formed along sidewalls of the contact openings 90. The contact spacers 112 can be formed by conformally depositing a dielectric layer in the contact openings 90, and then etching the dielectric layer. The dielectric layer can be formed of silicon nitride, silicon oxide, silicon oxynitride, aluminum oxide, or the like, and can be formed by a deposition process, such as CVD, ALD, or the like. The etching can be anisotropic.

Figure 15A:
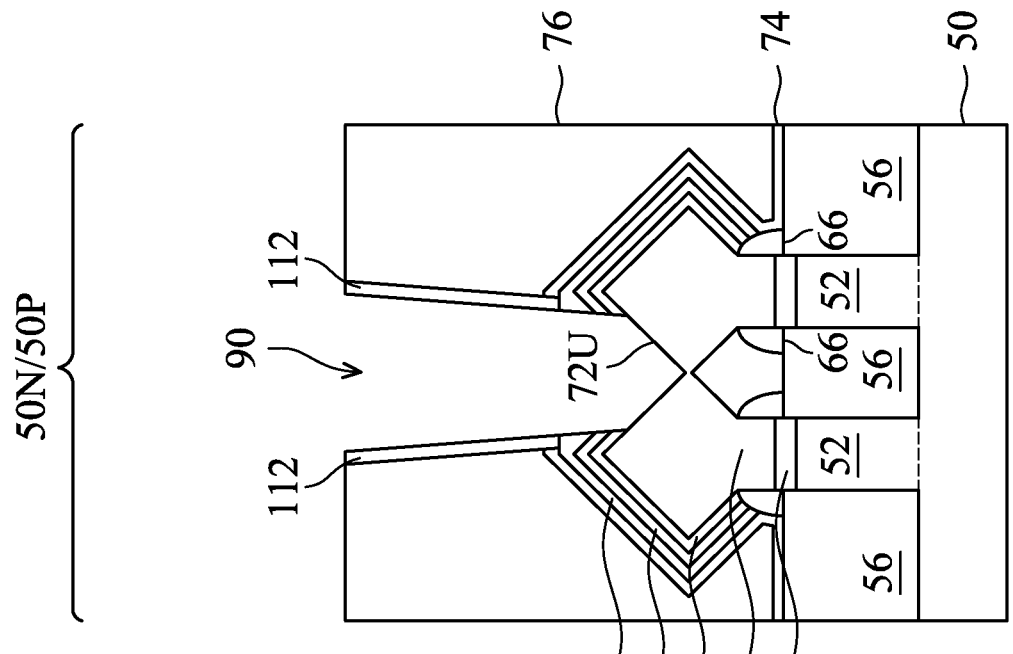
Figure 15B:
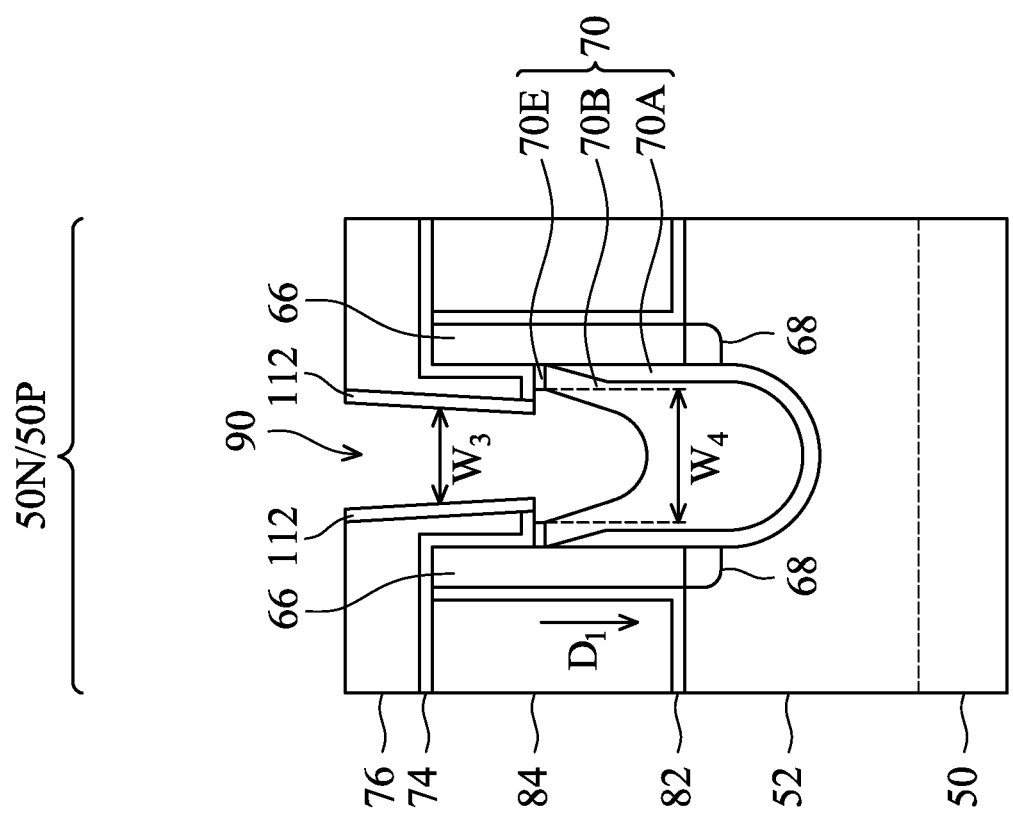

In FIGS. 15A and 15B, portions of the semiconductor CESLs 70C, dummy layers 70D, and finishing layers 70E are removed to expand the contact openings 90. The semiconductor CESLs 70C, dummy layers 70D, and finishing layers 70E can be removed using similar etching and oxidation techniques as those discussed above with respect to FIGS. 8A through 10B, e.g., by etching the finishing layers 70E and dummy layers 70D to expose the semiconductor CESLs 70C, oxidizing the exposed portions of the semiconductor CESLs 70C, and then etching the oxidized portions of the semiconductor CESLs 70C. After the contact openings 90 are expanded, sidewalls of the contact spacers 112, the semiconductor CESLs 70C, dummy layers 70D, and finishing layers 70E are exposed.

After the etching, the upper portions of the contact openings 90 (e.g., portions extending through the dielectric CESL 74 and first ILD layer 76) have a width $W_3$, which can be in the range of about 6 nm and about 25 nm, and the lower portions of the contact openings 90 (e.g., portions extending through the dummy layers 70D and into the epitaxial source/drain regions 70) have a width $W_4$, which can be in the range of about 5 nm and about 24 nm. The width $W_4$ is greater than the width $W_3$. For example, the width $W_4$ can be greater than the width $W_3$ by from about 3 nm to about 4 nm, and the ratio of $W_4:W_3$ can be in the range of about 1 to about 1.5. The width $W_4$ can continually decrease in the direction $D_1$.

Figure 16B:
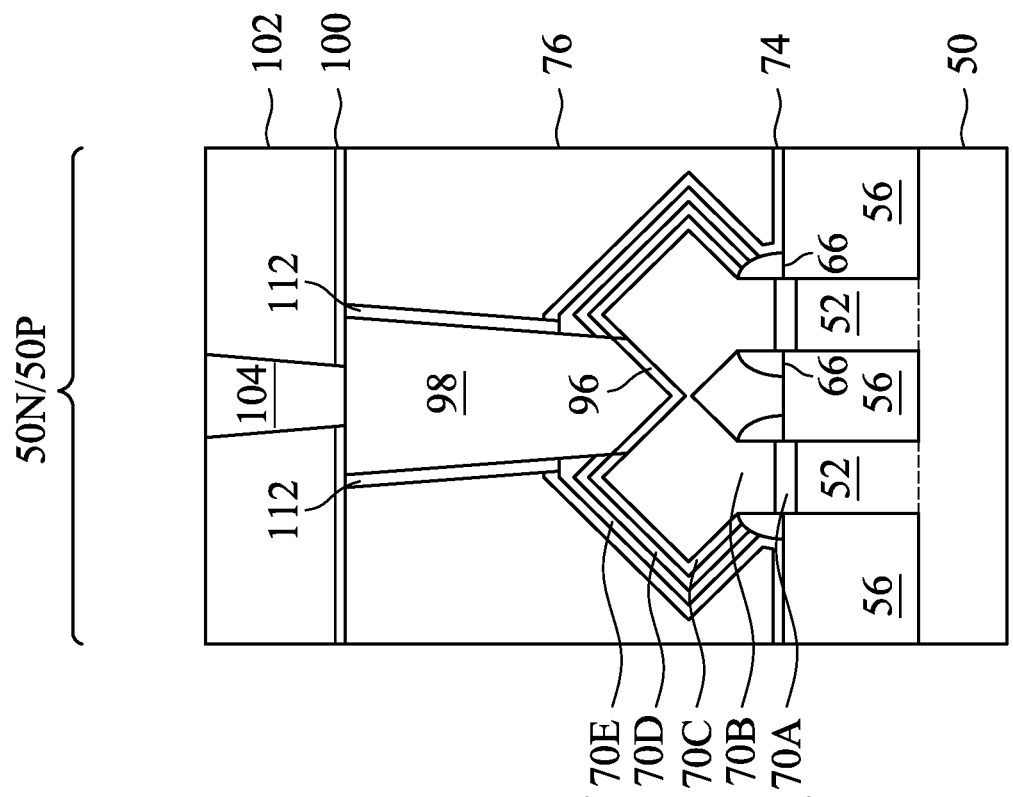
Figure 16A:
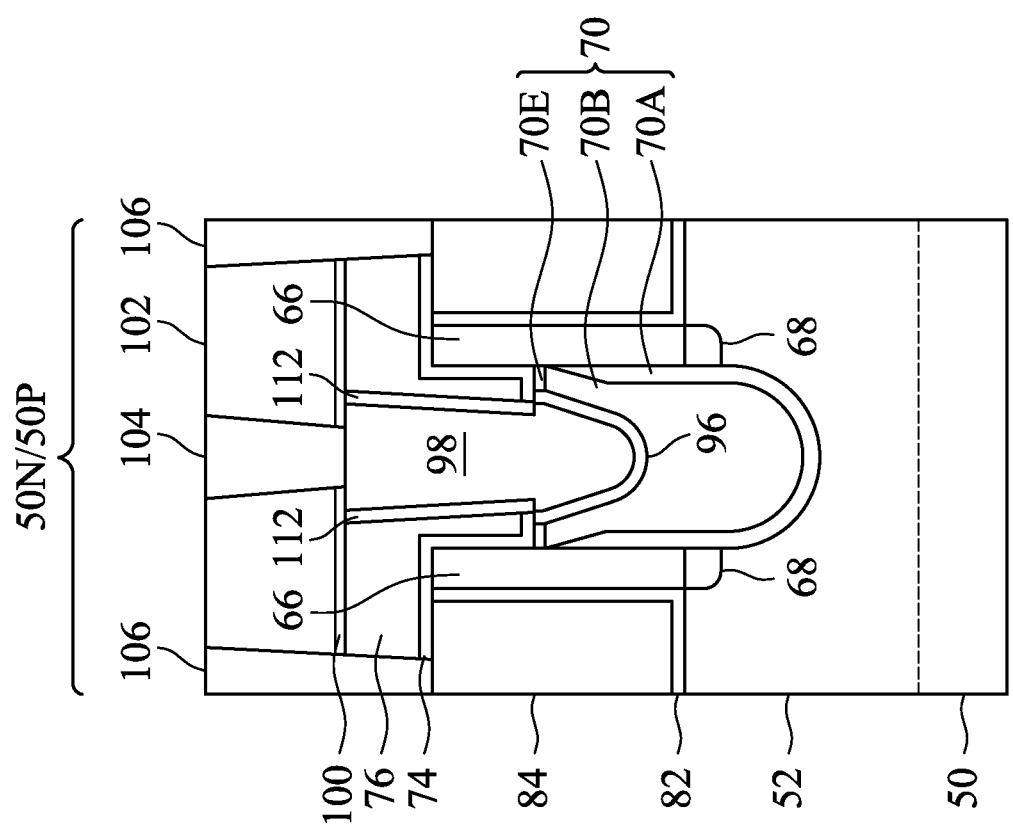

In FIGS. 16A and 16B, the lower source/drain contacts 98 and silicides 96 are formed in the contact openings 90. The lower source/drain contacts 98 and silicides 96 can be formed using similar techniques as those discussed above with respect to FIGS. 11A and 11B. After formation, upper portions of the lower source/drain contacts 98 are surrounded by the contact spacers 112, middle portions of the lower source/drain contacts 98 are surrounded by the finishing layers 70E, and lower portions of the lower source/drain contacts 98 are surrounded by the functional layers 70B. The etch stop layer 100, second ILD layer 102, upper source/drain contacts 104, and gate contacts 106 are then formed using similar techniques as those discussed above with respect to FIGS. 12A and 12B, except the gate contacts 106 also extend through the dielectric CESL 74 and first ILD layer 76.

FIGS. 17A through 21B are cross-sectional views of intermediate stages in the manufacturing of FinFETs, in accordance with some other embodiments. FIGS. 17A, 18A, 19A, 20A, and 21A are cross-sectional views illustrated along reference cross-section A-A in FIG. 1, except only one source/drain region 70 is shown. FIGS. 17B, 18B, 19B, 20B, and 21B are cross-sectional views illustrated along reference cross-section B-B in FIG. 1, except only two fins 52 are shown.

Figure 17B:
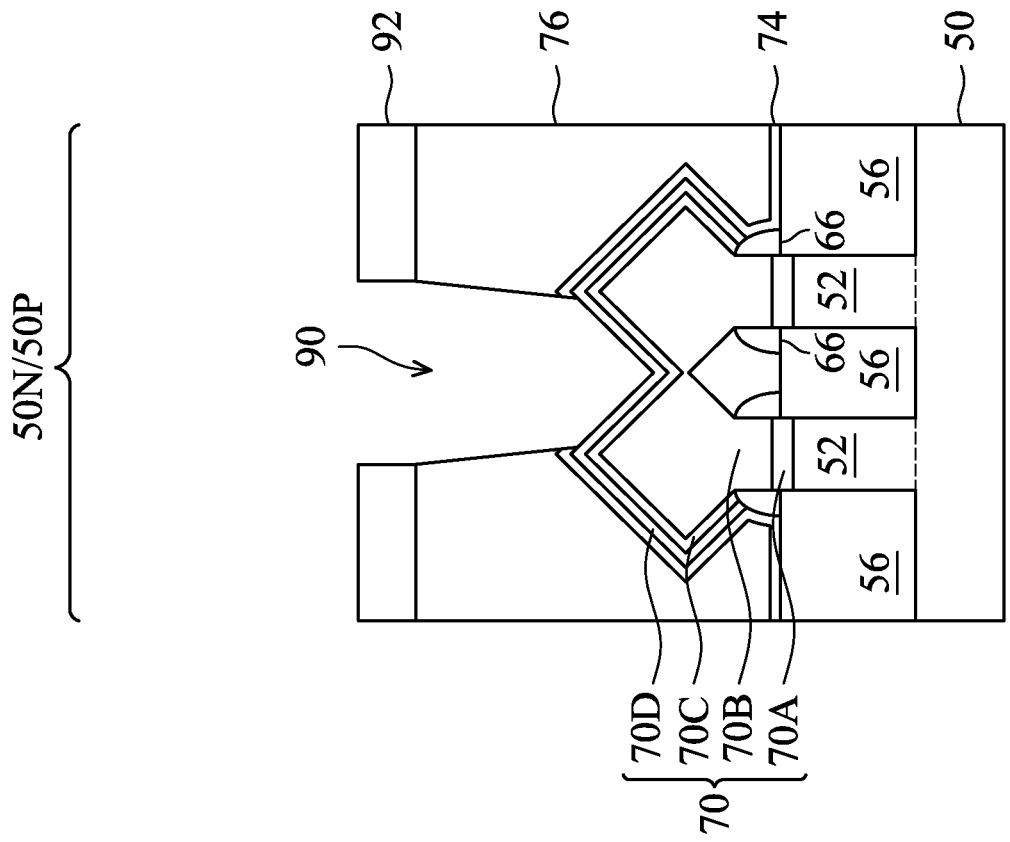
Figure 17A:
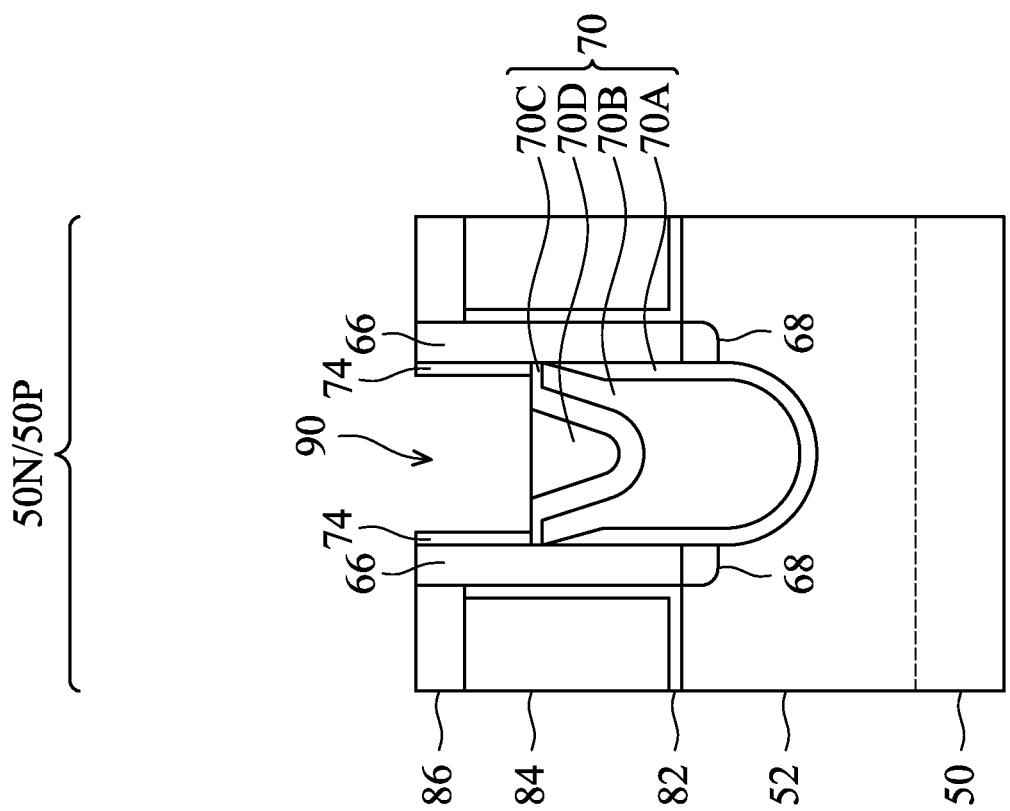

In FIGS. 17A and 17B, an intermediate structure similar to that of FIGS. 6A and 6B is obtained. In this embodiment, the finishing layers 70E are omitted from the epitaxial source/drain regions 70. As such, the dielectric CESL 74 is formed on portions of the semiconductor CESLs 70C and dummy layers 70D (see FIG. 17A). Portions of the first ILD layer 76 and dielectric CESL 74 are removed to form the contact openings 90. The first ILD layer 76 and dielectric CESL 74 can be removed using similar techniques as those discussed above with respect to FIGS. 7A and 7B, such as by using an etching mask 92 with slot openings.

As an example to form the epitaxial source/drain regions 70 without the finishing layers 70E, a plurality of epitaxial growth steps and etchback steps can be performed. Specifically, the functional layers 70A are grown on sidewalls of the recesses 52R, and the functional layers 70B are grown on the functional layers 70A. An etchback process is then performed to level the top surfaces of the functional layers 70B. After the etchback process, the semiconductor CESLs 70C are grown on the functional layers 70B, and the dummy layers 70D are grown on the semiconductor CESLs 70C. The growth can be conformal. Another etchback process is then performed to level the top surfaces of the layers 70C, 70D. When the finishing layers 70E are omitted, the upper basins 72U can remain unfilled so that the final top surfaces of the epitaxial source/drain regions 70 are convex.

Figure 18B:
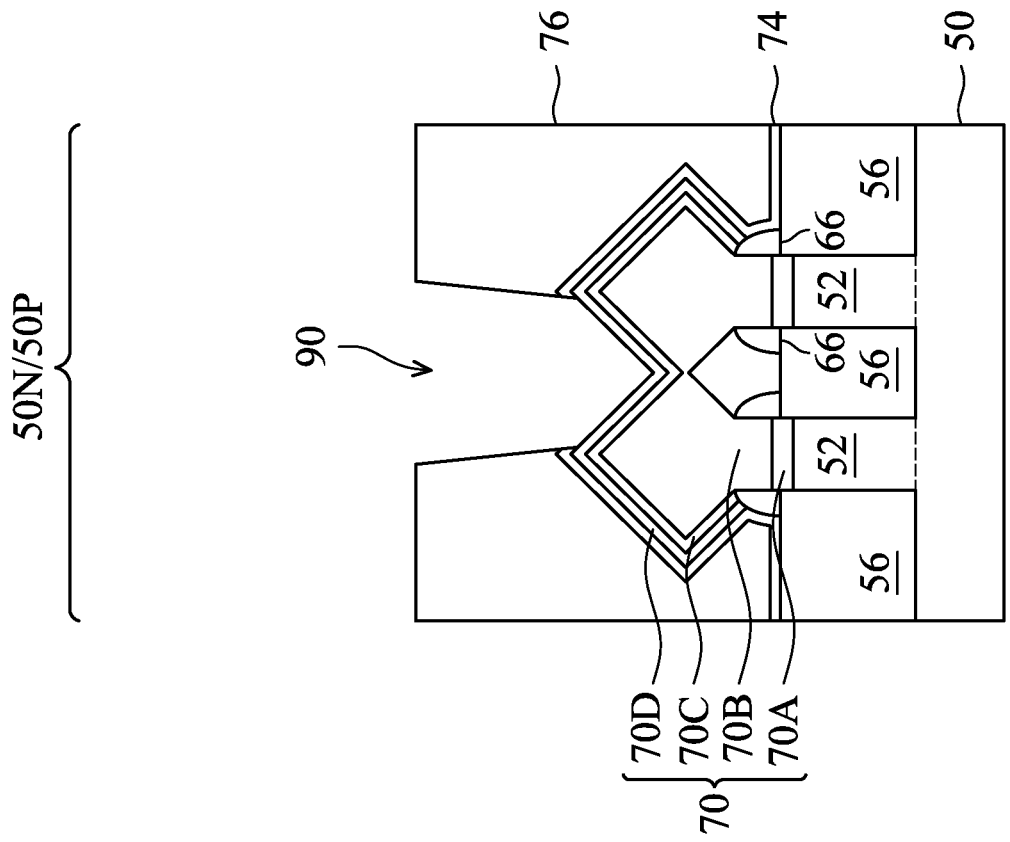
Figure 18A:
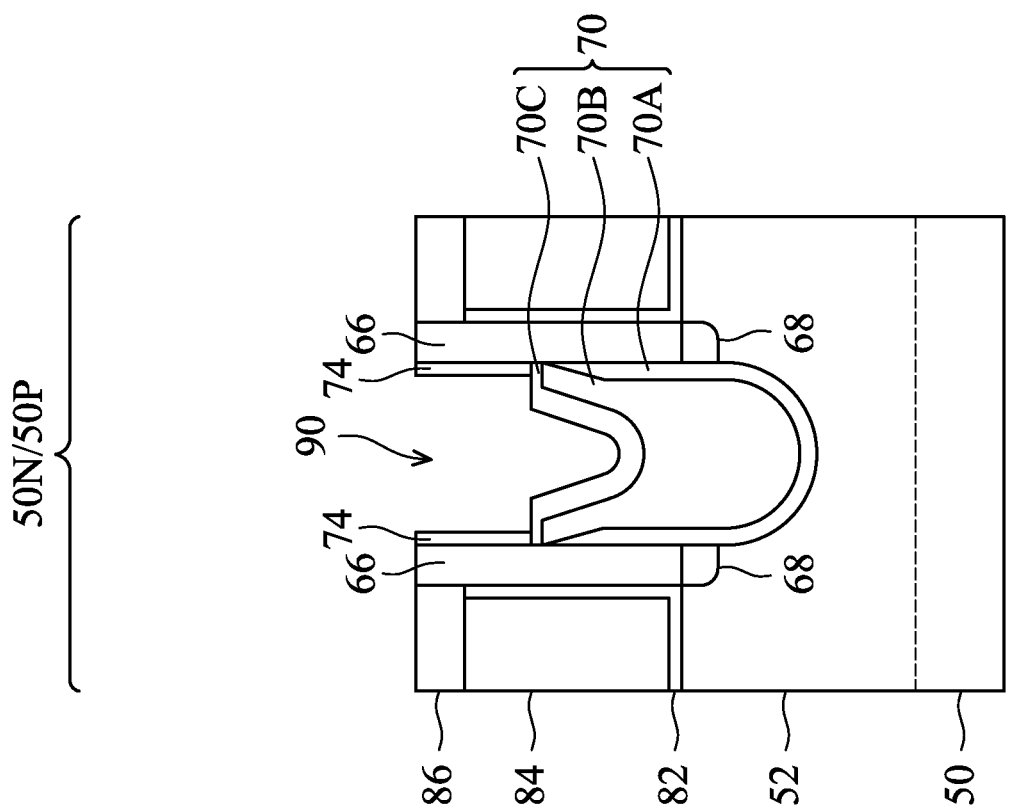

In FIGS. 18A and 18B, the dummy layers 70D are removed, so that the contact openings 90 are enlarged. The dummy layers 70D can be removed using similar etching techniques as those discussed above with respect to FIGS. 8A and 8B.

In FIGS. 19A and 19B, the exposed portions of the semiconductor CESLs 70C in the contact openings 90 are oxidized to form dielectric layers 94. The semiconductor CESLs 70C can be oxidized using similar techniques as those discussed above with respect to FIGS. 9A and 9B. As discussed above, unexposed portions of the semiconductor CESLs 70C are not oxidized. Further, in this embodiment, some unoxidized portions of the semiconductor CESLs 70C remain between the dielectric CESL 74 and functional layers 70B.

Figure 20A:
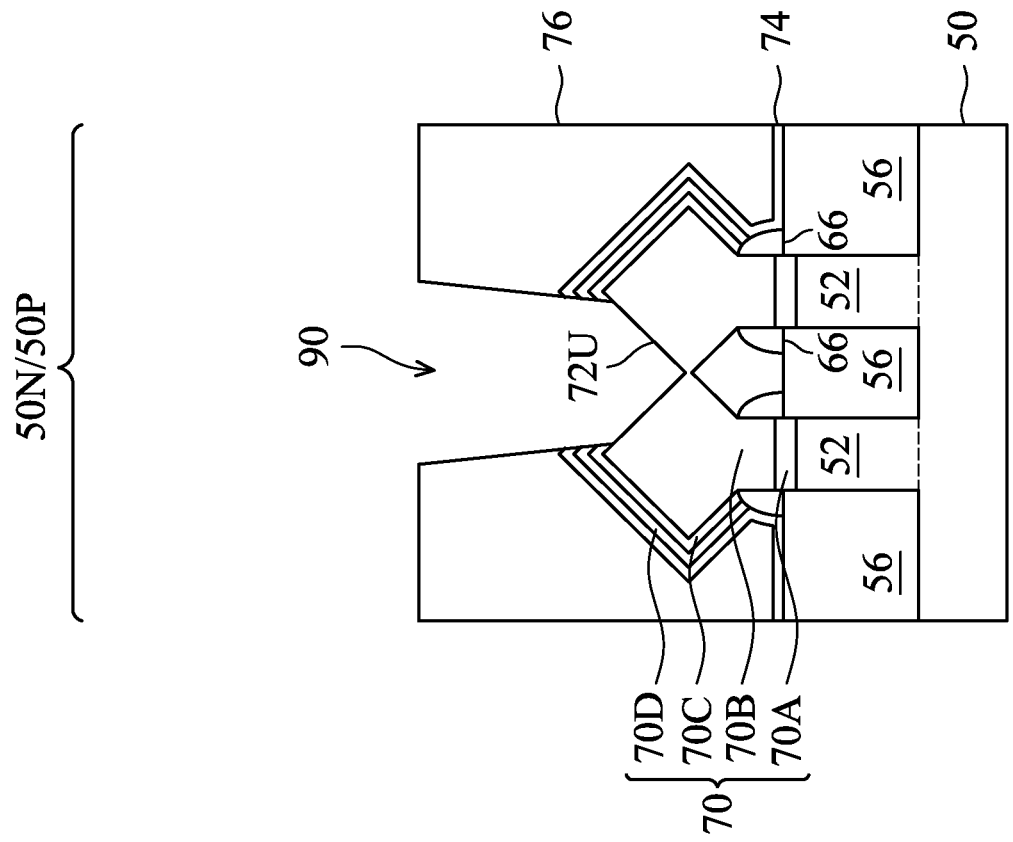
Figure 20B:
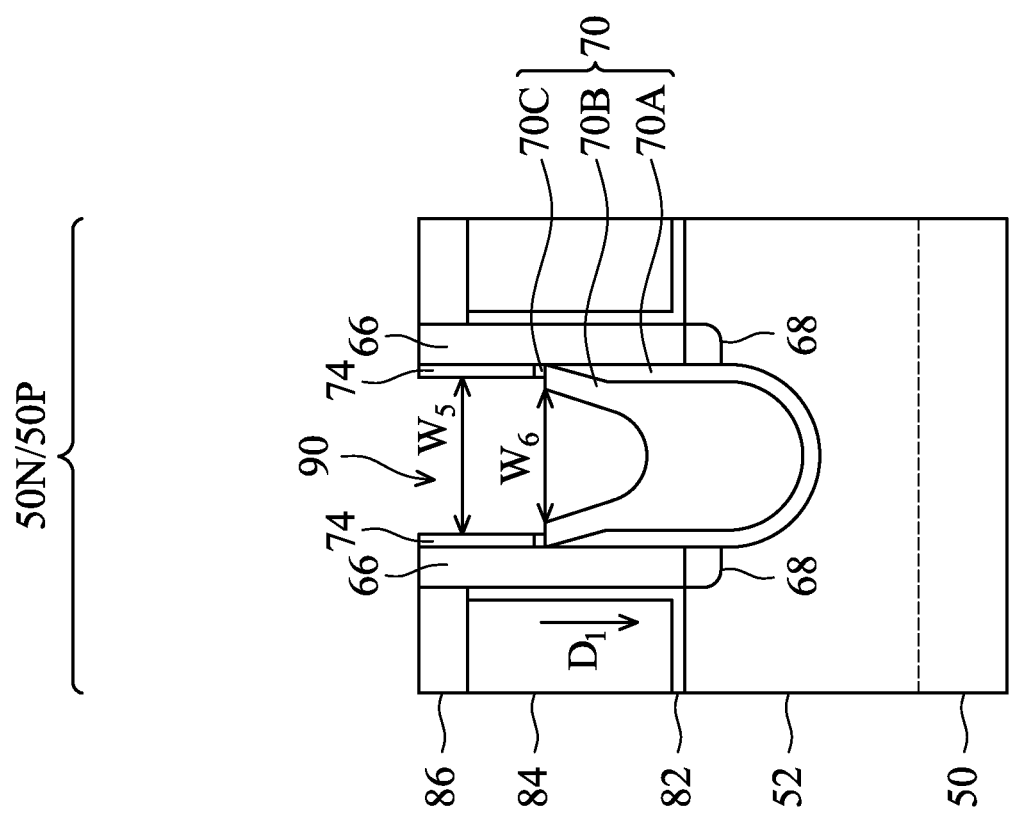

In FIGS. 20A and 20B, the dielectric layers 94 are removed so that the contact openings 90 are enlarged. The dielectric layers 94 can be removed using similar techniques as those discussed above with respect to FIGS. 10A and 10B. As discussed above, etching does not remove the unoxidized portions of the semiconductor CESLs 70C. After the etching, the upper portions of the contact openings 90 (e.g., portions extending through the dielectric CESL 74 and first ILD layer 76) have a width $W_5$, which can be in the range of about 6 nm and about 30 nm, and the lower portions of the contact openings 90 (e.g., portions extending through the dummy layers 70D and into the epitaxial source/drain regions 70) have a width $W_6$, which can be in the range of about 5 nm and about 30 nm. The width $W_5$ is greater than the width $W_6$. For example, the width $W_5$ can be greater than the width $W_6$ by up to about 3 nm, and the ratio of $W_5$:$W_6$ can be in the range of about 1 to about 1.5. The width $W_6$ can continually decrease in the direction $D_1$.

Figure 21B:
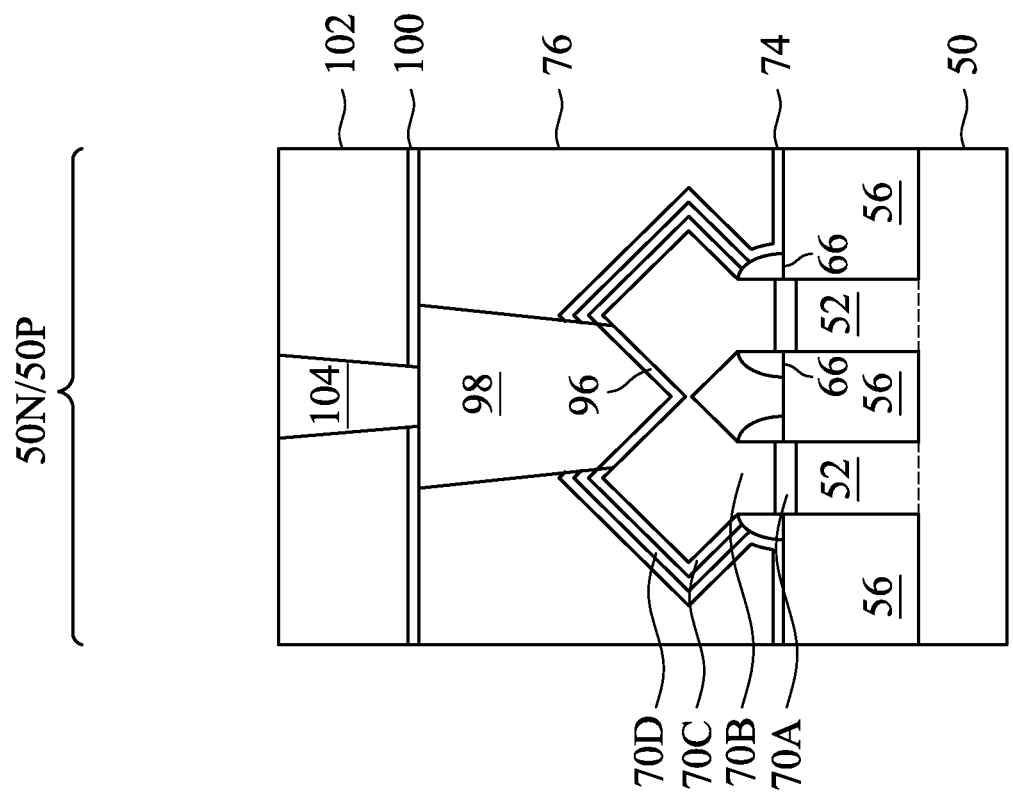
Figure 21A:
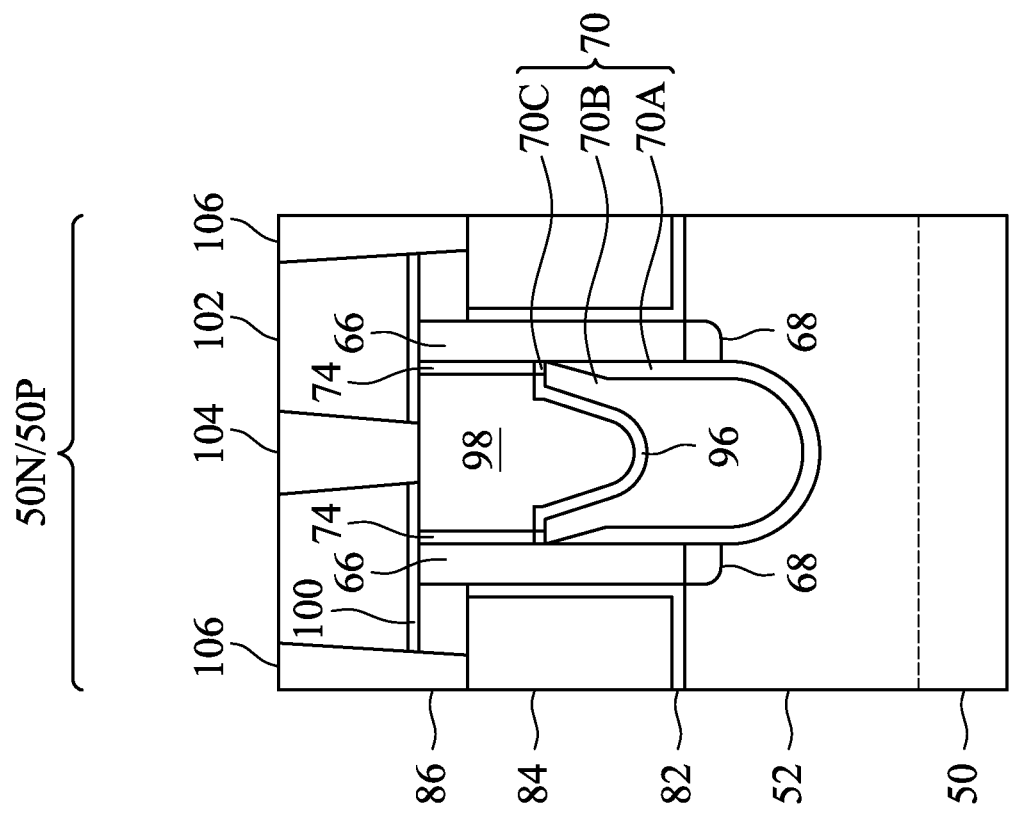

In FIGS. 21A and 21B, the lower source/drain contacts 98 and silicides 96 are formed in the contact openings 90. The lower source/drain contacts 98 and silicides 96 can be formed using similar techniques as those discussed above with respect to FIGS. 11A and 11B. After formation, upper portions of the lower source/drain contacts 98 are surrounded by the dielectric CESL 74, middle portions of the lower source/drain contacts 98 are surrounded by the unoxidized portions of the semiconductor CESLs 70C, and lower portions of the lower source/drain contacts 98 are surrounded by the functional layers 70B. The etch stop layer 100, second ILD layer 102, upper source/drain contacts 104, and gate contacts 106 are then formed using similar techniques as those discussed above with respect to FIGS. 12A and 12B.

FIGS. 22A through 25B are cross-sectional views of intermediate stages in the manufacturing of FinFETs, in accordance with some other embodiments. FIGS. 22A, 23A, 24A, and 25A are cross-sectional views illustrated along reference cross-section A-A in FIG. 1, except only one source/drain region 70 is shown. FIGS. 22B, 23B, 24B, and 25B are cross-sectional views illustrated along reference cross-section B-B in FIG. 1, except only two fins 52 are shown.

Figure 22B:
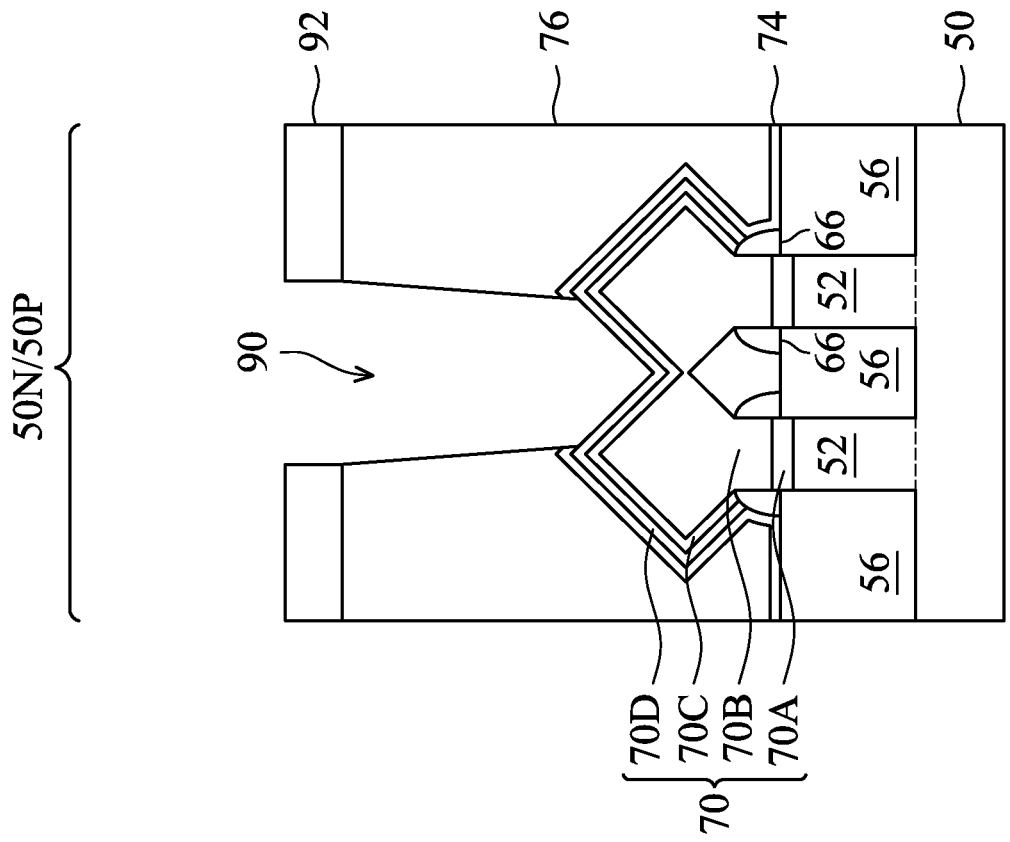
FIGS. 22A through 25B are cross-sectional views of intermediate stages in the manufacturing of FinFETs, in accordance with some other embodiments.
Figure 22A:
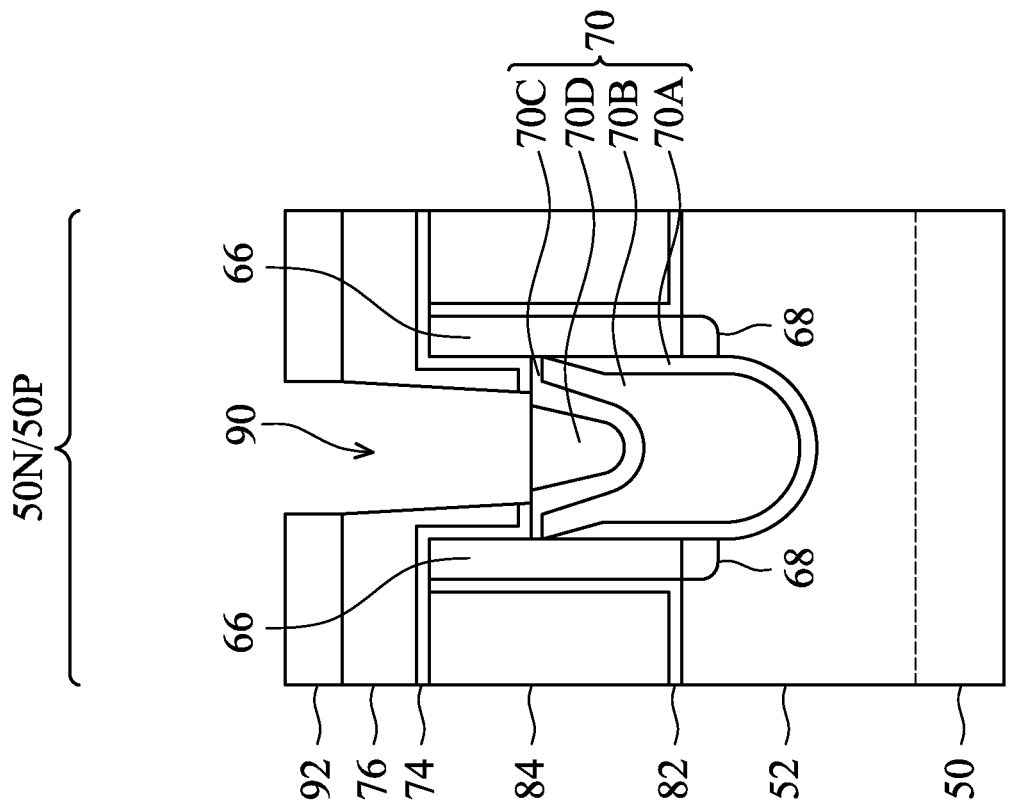

In FIGS. 22A and 22B, an intermediate structure similar to that of FIGS. 6A and 6B is obtained, except the gate masks 86 are omitted, and the planarization process on the first ILD layer 76 (discussed with respect to FIGS. 5A and 5B) is also omitted. Thus, the dielectric CESL 74 and first ILD layer 76 have portions disposed over the gate electrodes 84. In this embodiment, the finishing layers 70E are omitted from the epitaxial source/drain regions 70. Portions of the first ILD layer 76 and dielectric CESL 74 are removed to form the contact openings 90. The first ILD layer 76 and dielectric CESL 74 can be removed using similar techniques as those discussed above with respect to FIGS. 13A and 13B, such as by using an etching mask 92 with bounded openings.

Figure 23B:
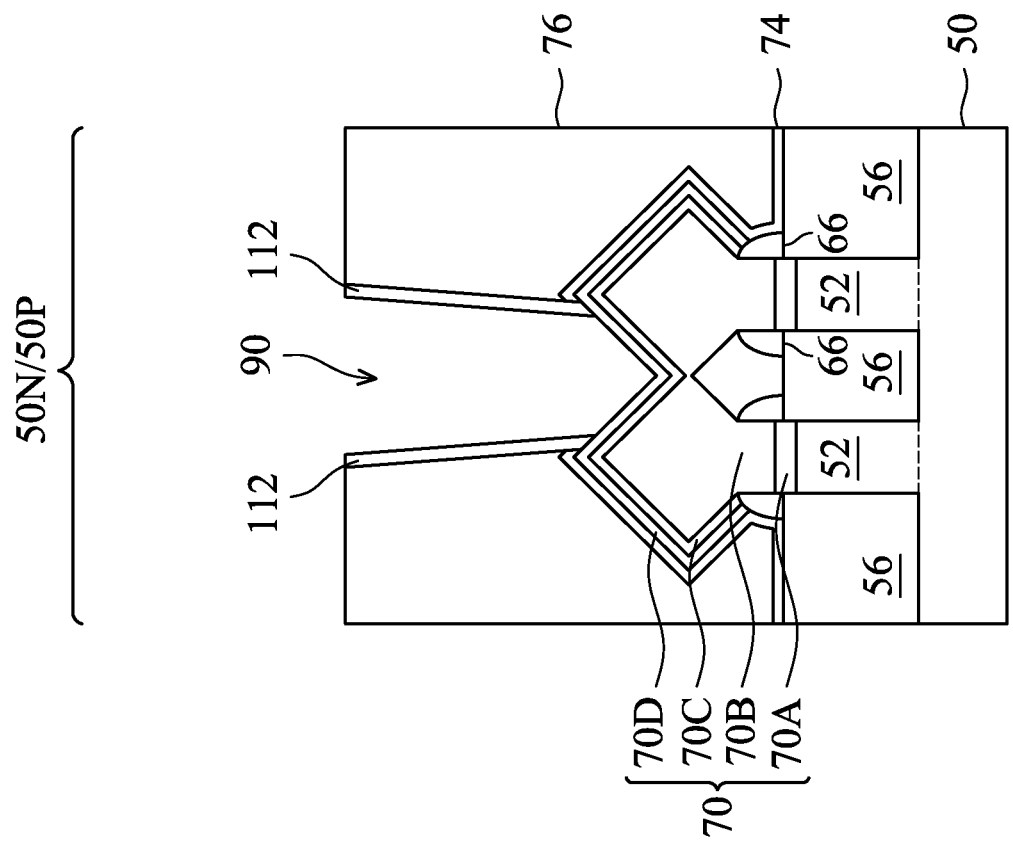
Figure 23A:
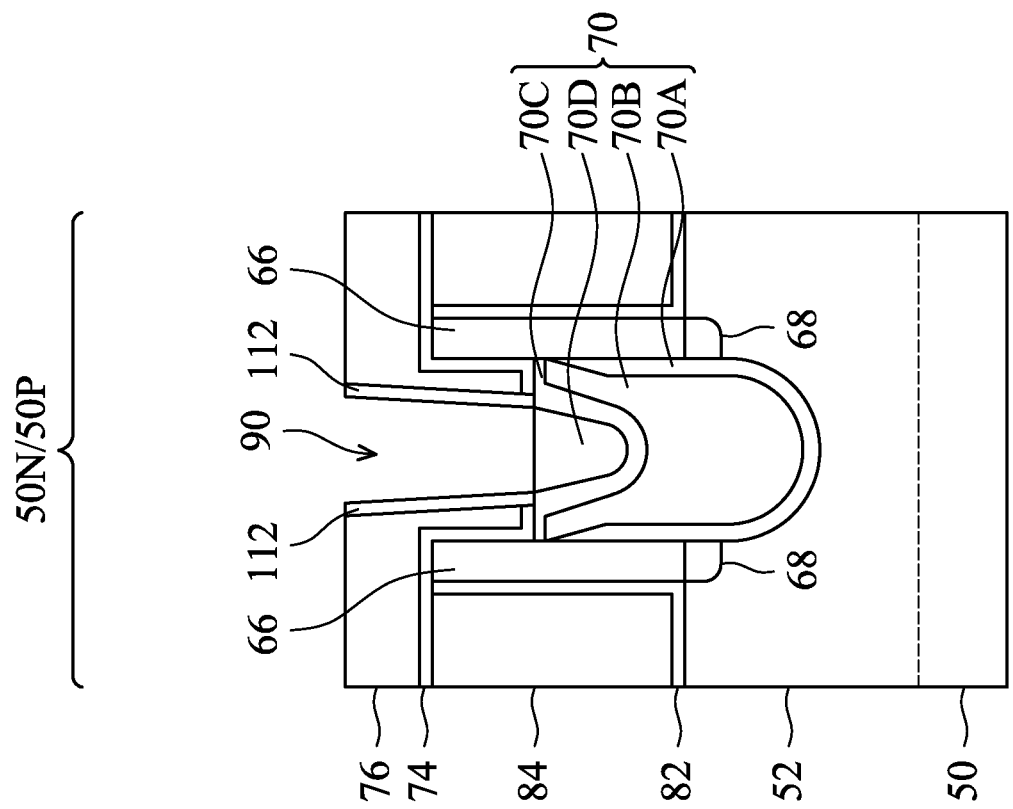

In FIGS. 23A and 23B, the contact spacers 112 are formed along sidewalls of the contact openings 90. The contact spacers 112 can be formed using similar techniques as those discussed above with respect to FIGS. 14A and 14B.

Figure 24B:
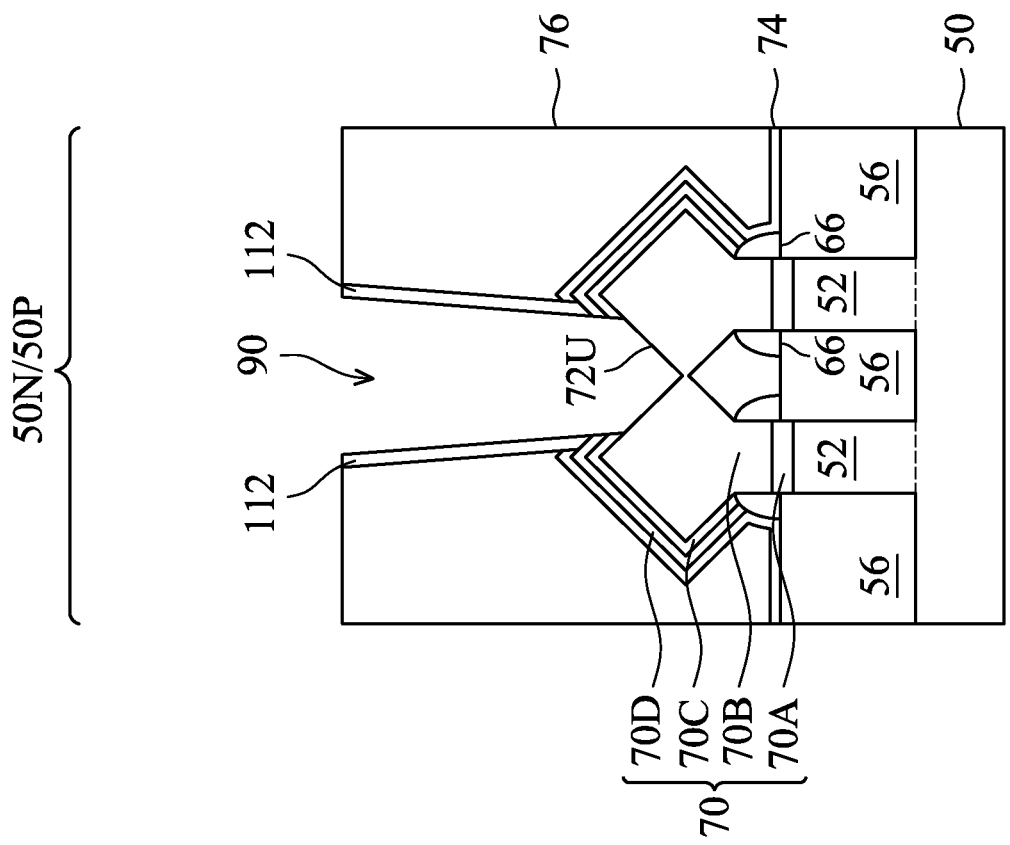
Figure 24A:
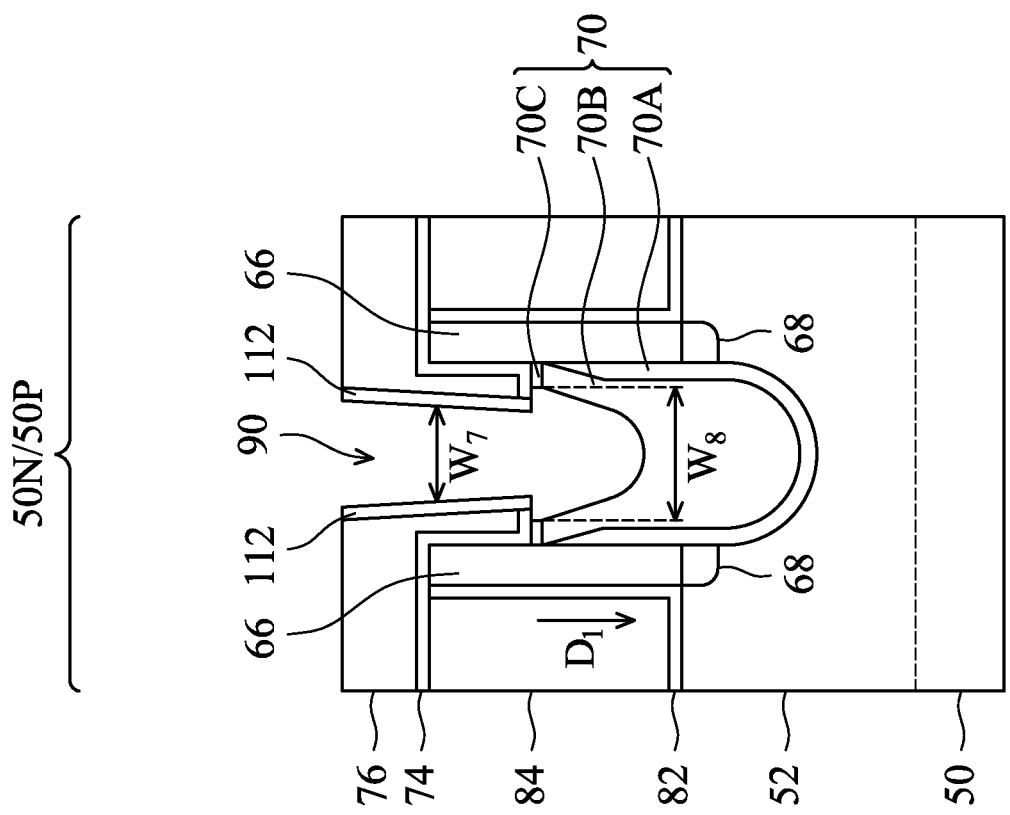

In FIGS. 24A and 24B, portions of the semiconductor CESLs 70C and dummy layers 70D are removed to expand the contact openings 90. The semiconductor CESLs 70C and dummy layers 70D can be removed using similar etching and oxidation techniques as those discussed above with respect to FIGS. 8A through 10B, e.g., by etching the dummy layers 70D to expose the semiconductor CESLs 70C, oxidizing the exposed portions of the semiconductor CESLs 70C, and then etching the oxidized portions of the semiconductor CESLs 70C. After the contact openings 90 are expanded, sidewalls of the contact spacers 112 and the semiconductor CESLs 70C and dummy layers 70D are exposed. Further, some unoxidized portions of the semiconductor CESLs 70C may remain between the dielectric CESL 74 and functional layers 70B. After the etching, the upper portions of the contact openings 90 (e.g., portions extending through the dielectric CESL 74 and first ILD layer 76) have a width $W_7$, which can be in the range of about 6 nm and about 25 nm, and the lower portions of the contact openings 90 (e.g., portions extending through the dummy layers 70D and into the epitaxial source/drain regions 70) have a width $W_8$, which can be in the range of about 5 nm and about 24 nm. The width $W_8$ is greater than the width $W_7$. For example, the width $W_8$ can be greater than the width $W_7$ by up to about 3 nm, and the ratio of $W_8$:$W_7$ can be in the range of about 1 to about 1.5. The width $W_8$ can continually decrease in the direction $D_1$.

Figure 25B:
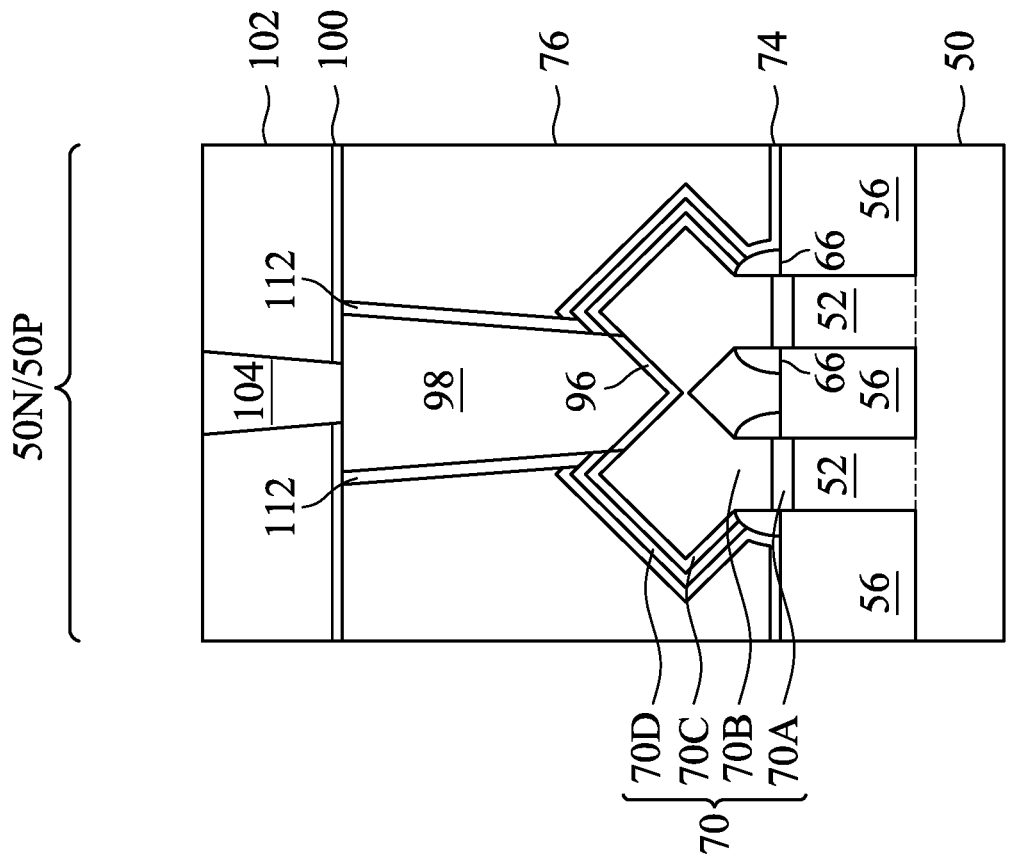
Figure 25A:
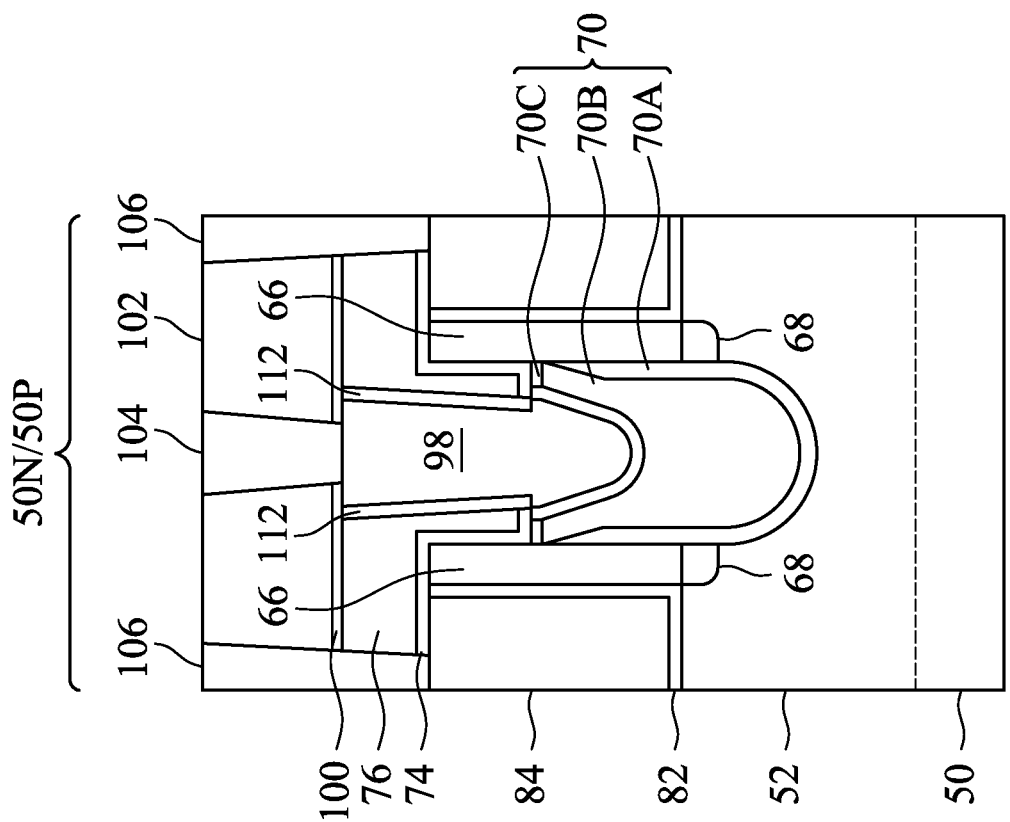

In FIGS. 25A and 25B, the lower source/drain contacts 98 and silicides 96 are formed in the contact openings 90. The lower source/drain contacts 98 and silicides 96 can be formed using similar techniques as those discussed above with respect to FIGS. 11A and 11B. After formation, upper portions of the lower source/drain contacts 98 are surrounded by the contact spacers 112, middle portions of the lower source/drain contacts 98 are surrounded by the unoxidized portions of the semiconductor CESLs 70C, and lower portions of the lower source/drain contacts 98 are surrounded by the functional layers 70B. The etch stop layer 100, second ILD layer 102, upper source/drain contacts 104, and gate contacts 106 are then formed using similar techniques as those discussed above with respect to FIGS. 12A and 12B, except the gate contacts 106 also extend through the dielectric CESL 74 and first ILD layer 76.

Other variations are possible. For example, in some embodiments, the dummy layer 70D and finishing layer 70E are both omitted. The semiconductor CESLs 70C can thus fill the upper basins 72U, and the dielectric CESL 74 can be formed directly on the semiconductor CESLs 70C.

Embodiments may achieve advantages. Forming the epitaxial source/drain regions 70 to include the semiconductor CESLs 70C allows the lower source/drain contacts 98 to be formed extending into the epitaxial source/drain regions 70 by a desired depth. The contact area for the lower source/drain contacts 98 can thus be increased, thereby decreasing the contact resistance and increasing the operating current ($I_{ON}$) of the resulting FinFETs. Further, extending the lower source/drain contacts 98 into the epitaxial source/drain regions 70 with a semiconductor CESL instead of a timed etch allows the amount of material removed from the functional layers 70B to be reduced. Because the functional layers 70B have a high dopant concentration, reducing losses of the functional layers 70B can increase the performance of the resulting FinFETs.

In an embodiment, a method includes: depositing an inter-layer dielectric (ILD) layer over an epitaxial source/drain region, the epitaxial source/drain region including a main layer, a semiconductor contact etch stop layer (CESL) on the main layer, and a dummy layer on the semiconductor CESL; exposing a first portion of the dummy layer through the ILD layer; removing the first portion of the dummy layer with a first etching process to expose a second portion of the semiconductor CESL, the first etching process etching the dummy layer at a greater rate than the semiconductor CESL; removing the second portion of the semiconductor CESL to expose a third portion of the main layer; and forming a first source/drain contact on the third portion of the main layer. In some embodiments of the method, the dummy layer is formed of silicon germanium, the semiconductor CESL is formed of silicon, the main layer is formed of phosphorous doped silicon or boron doped silicon germanium, and the first etching process includes: etching the silicon germanium with a mixture of $H_2SO_4$ and $H_2O_2$ for a duration in a range of 5 seconds to 300 seconds. In some embodiments of the method, the dummy layer is formed of aluminum oxide, the semiconductor CESL is formed of silicon, the main layer is formed of phosphorous doped silicon or boron doped silicon germanium, and the first etching process includes: etching the aluminum oxide with ammonia ($NH_3$) for a duration in a range of 5 seconds to 200 seconds. In some embodiments of the method, removing the second portion of the semiconductor CESL includes: oxidizing the second portion of the semiconductor CESL to form a dielectric layer; and removing the dielectric layer with a second etching process, the second etching process etching the dielectric layer at a greater rate than the main layer. In some embodiments of the method, the semiconductor CESL is formed of silicon, the dielectric layer is formed of silicon oxide, and the second etching process includes: etching the silicon oxide with dilute hydrofluoric (dHF) acid for a duration in a range of 10 seconds to 30 seconds. In some embodiments of the method, exposing the first portion of the dummy layer includes removing a portion of the ILD layer over the epitaxial source/drain region to form an opening, the opening being wider than the second portion of the semiconductor CESL, and further including: forming a silicide in the opening, the silicide disposed between the first source/drain contact and the epitaxial source/drain region. In some embodiments of the method, exposing the first portion of the dummy layer includes removing a portion of the ILD layer over the epitaxial source/drain region to form an opening, the opening being narrower than the second portion of the semiconductor CESL, and further including: forming a contact spacer in the opening, the contact spacer surrounding the first source/drain contact; and forming a silicide in the opening, the silicide disposed between the first source/drain contact and the epitaxial source/drain region. In some embodiments of the method, the epitaxial source/drain region further includes a finishing layer on the dummy layer, and further including: depositing a dielectric CESL on the finishing layer, the ILD layer being deposited over the dielectric CESL; exposing a fourth portion of the finishing layer through the dielectric CESL; and removing the fourth portion of the finishing layer to expose the first portion of the dummy layer, a fifth portion of the finishing layer remaining between the dielectric CESL and the main layer after forming the first source/drain contact. In some embodiments, the method further includes: depositing a dielectric CESL on the dummy layer and the semiconductor CESL, the ILD layer being deposited over the dielectric CESL; and exposing the first portion of the dummy layer through the dielectric CESL, a fourth portion of the semiconductor CESL remaining between the dielectric CESL and the main layer after forming the first source/drain contact.

In an embodiment, a device includes: a semiconductor substrate; a first fin extending from the semiconductor substrate; a second fin extending from the semiconductor substrate; an epitaxial source/drain region including: a main layer in the first fin and the second fin, the main layer including a first semiconductor material, the main layer having an upper faceted surface and a lower faceted surface, the upper faceted surface and the lower faceted surface each being raised from respective surfaces of the first fin and the second fin; and a semiconductor contact etch stop layer (CESL) contacting the upper faceted surface and the lower faceted surface of the main layer, the semiconductor CESL including a second semiconductor material, the second semiconductor material being different from the first semiconductor material.

In some embodiments, the device further includes: an inter-layer dielectric (ILD) layer over the epitaxial source/drain region; and a source/drain contact having a first portion and a second portion, the first portion extending through the ILD layer, the second portion extending into the epitaxial source/drain region, the first portion having a first width, the second portion having a second width, the second width being greater than the first width. In some embodiments, the device further includes: an inter-layer dielectric (ILD) layer over the epitaxial source/drain region; and a source/drain contact having a first portion and a second portion, the first portion extending through the ILD layer, the second portion extending into the epitaxial source/drain region, the first portion having a first width, the second portion having a second width, the second width being less than the first width. In some embodiments of the device, the epitaxial source/drain region further includes a dummy layer contacting the semiconductor CESL, the dummy layer including a third semiconductor material, the third semiconductor material different from each of the first semiconductor material and the second semiconductor material. In some embodiments of the device, the epitaxial source/drain region further includes a finishing layer contacting the dummy layer, the finishing layer including the first semiconductor material, and further including: a dielectric CESL over the epitaxial source/drain region, a portion of the finishing layer contacting the main layer and the dielectric CESL. In some embodiments, the device further includes: a dielectric CESL over the epitaxial source/drain region, a portion of the semiconductor CESL contacting the main layer and the dielectric CESL. In some embodiments of the device, the first semiconductor material is phosphorous doped silicon or boron doped silicon germanium, the second semiconductor material is silicon, and the third semiconductor material is silicon germanium. In some embodiments of the device, the first semiconductor material is phosphorous doped silicon or boron doped silicon germanium, the second semiconductor material is silicon, and the third semiconductor material is aluminum oxide.

In an embodiment, a device includes: a semiconductor substrate; a first fin extending from the semiconductor substrate; a second fin extending from the semiconductor substrate; an epitaxial source/drain region including: a main layer in the first fin and the second fin, the main layer including a doped semiconductor material; a first contact etch stop layer (CESL) on the main layer, the first CESL including an undoped semiconductor material; and a finishing layer on the first CESL, the finishing layer including the doped semiconductor material; a second CESL on the finishing layer, the second CESL including a dielectric material; an inter-layer dielectric (ILD) layer on the second CESL; and a source/drain contact extending through the ILD layer, the second CESL, the finishing layer, and the first CESL, the source/drain contact contacting the main layer.

In some embodiments of the device, a first portion of the source/drain contact extends through the first CESL, and a second portion of the source/drain contact extends through the second CESL, the first portion being wider than the second portion. In some embodiments of the device, a first portion of the source/drain contact extends through the first CESL, and a second portion of the source/drain contact extends through the second CESL, the first portion being narrower than the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first fin extending from a semiconductor substrate;
   a second fin extending from the semiconductor substrate;
   an epitaxial source/drain region comprising:
      a main layer in the first fin and the second fin, the main layer having an upper faceted surface and a lower faceted surface, the upper faceted surface and the lower faceted surface each being raised from respective surfaces of the first fin and the second fin, the main layer comprising a first semiconductor material, the first semiconductor material being phosphorous-doped silicon or boron-doped silicon germanium;
      a semiconductor contact etch stop layer contacting the upper faceted surface and the lower faceted surface of the main layer, the semiconductor contact etch stop layer comprising a second semiconductor material, the second semiconductor material being silicon;
      a dummy layer contacting the semiconductor contact etch stop layer, the dummy layer comprising a third semiconductor material, the third semiconductor material being silicon germanium or aluminum oxide; and
      a finishing layer contacting the dummy layer, the finishing layer comprising the first semiconductor material.

2. The device of claim 1 further comprising:
   an inter-layer dielectric over the epitaxial source/drain region; and
   a source/drain contact having a first portion and a second portion, the first portion extending through the inter-layer dielectric, the second portion extending into the epitaxial source/drain region, the first portion having a first width, the second portion having a second width, the second width being greater than the first width.

3. The device of claim 1 further comprising:
   an inter-layer dielectric over the epitaxial source/drain region; and
   a source/drain contact having a first portion and a second portion, the first portion extending through the inter-layer dielectric, the second portion extending into the epitaxial source/drain region, the first portion having a first width, the second portion having a second width, the second width being less than the first width.

4. The device of claim 1, further comprising:
   a dielectric contact etch stop layer over the epitaxial source/drain region, a portion of the finishing layer contacting the main layer and the dielectric contact etch stop layer.

5. The device of claim 1 further comprising:
   a dielectric contact etch stop layer over the epitaxial source/drain region, a portion of the semiconductor contact etch stop layer contacting the main layer and the dielectric contact etch stop layer.

6. A device comprising:
   a first fin extending from a semiconductor substrate;
   a second fin extending from the semiconductor substrate;
   an epitaxial source/drain region comprising:
      a main layer in the first fin and the second fin, the main layer comprising a doped semiconductor material;
      a first contact etch stop layer on the main layer, the first contact etch stop layer comprising an undoped semiconductor material; and
      a finishing layer on the first contact etch stop layer, the finishing layer comprising the doped semiconductor material;
   a second contact etch stop layer on the finishing layer, the second contact etch stop layer comprising a dielectric material;
   an inter-layer dielectric on the second contact etch stop layer; and
   a source/drain contact extending through the inter-layer dielectric, the second contact etch stop layer, the finishing layer, and the first contact etch stop layer, the source/drain contact contacting the main layer.

7. The device of claim 6, wherein a first portion of the source/drain contact extends through the first contact etch stop layer, and a second portion of the source/drain contact extends through the second contact etch stop layer, the first portion being wider than the second portion.

8. The device of claim 6, wherein a first portion of the source/drain contact extends through the first contact etch stop layer, and a second portion of the source/drain contact extends through the second contact etch stop layer, the first portion being narrower than the second portion.

9. The device of claim 6, wherein the undoped semiconductor material is silicon.

10. The device of claim 6, wherein the doped semiconductor material is phosphorous-doped silicon.

11. The device of claim 6, wherein the doped semiconductor material is boron-doped silicon germanium.

12. A device comprising:
   a semiconductor fin extending from a semiconductor substrate;
   a source/drain region comprising:

a first doped semiconductor layer in the semiconductor fin, the first doped semiconductor layer having facets which extend laterally outward beyond sidewalls of the semiconductor fin;

an undoped semiconductor layer on the first doped semiconductor layer;

a dummy semiconductor layer on the undoped semiconductor layer; and a second doped semiconductor layer on the dummy semiconductor layer, wherein the first doped semiconductor layer and the second doped semiconductor layer each comprise a same semiconductor material;

a dielectric layer on the source/drain region, the dielectric layer comprising a first dielectric material;

an inter-layer dielectric on the dielectric layer, the inter-layer dielectric comprising a second dielectric material, the second dielectric material different from the first dielectric material; and a source/drain contact extending through the inter-layer dielectric, the dielectric layer, the second doped semiconductor layer, the dummy semiconductor layer, and the undoped semiconductor layer, the source/drain contact contacting the first doped semiconductor layer.

13. The device of claim 12, wherein the undoped semiconductor layer comprises silicon.

14. The device of claim 12, wherein the first doped semiconductor layer and the second doped semiconductor layer each comprise phosphorous-doped silicon.

15. The device of claim 12, wherein the first doped semiconductor layer and the second doped semiconductor layer each comprise boron-doped silicon germanium.

16. The device of claim 12 further comprising:

a first gate spacer; and a second gate spacer, the source/drain region disposed between the first gate spacer and the second gate spacer, wherein a first portion of the source/drain contact extends through the undoped semiconductor layer, a second portion of the source/drain contact extends through the dielectric layer, and the first portion is wider than the second portion in a direction extending between the first gate spacer and the second gate spacer.

17. The device of claim 12 further comprising:

a first gate spacer; and a second gate spacer, the source/drain region disposed between the first gate spacer and the second gate spacer, wherein a first portion of the source/drain contact extends through the undoped semiconductor layer, a second portion of the source/drain contact extends through the dielectric layer, and the second portion is wider than the first portion in a direction extending between the first gate spacer and the second gate spacer.

18. The device of claim 12 further comprising:

a gate structure; and a gate spacer between the gate structure and the source/drain region, the first doped semiconductor layer contacting a sidewall of the gate spacer, the first doped semiconductor layer disposed between the undoped semiconductor layer and the sidewall of the gate spacer.

19. The device of claim 12 further comprising:

a gate structure; and a gate spacer between the gate structure and the source/drain region, the first doped semiconductor layer contacting a sidewall of the gate spacer, the undoped semiconductor layer contacting the sidewall of the gate spacer.

20. The device of claim 12, wherein the first doped semiconductor layer, the second doped semiconductor layer, and the dummy semiconductor layer each comprise silicon germanium, the dummy semiconductor layer having a greater concentration of germanium than the first doped semiconductor layer and the second doped semiconductor layer.

* * * * *